United States Patent
Yamaguchi et al.

(10) Patent No.: US 7,335,556 B2
(45) Date of Patent: Feb. 26, 2008

(54) MANUFACTURING METHOD OF SEMICONDUCTOR DEVICE

(75) Inventors: Tetsuji Yamaguchi, Kanagawa (JP); Hajime Tokunaga, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 173 days.

(21) Appl. No.: 11/146,271

(22) Filed: Jun. 7, 2005

(65) Prior Publication Data

US 2005/0276115 A1   Dec. 15, 2005

(30) Foreign Application Priority Data

Jun. 14, 2004   (JP)   ............... 2004-176189

(51) Int. Cl.
*H01L 21/8247* (2006.01)

(52) U.S. Cl. .................................. 438/257; 438/593

(58) Field of Classification Search ........ 438/257–267, 438/593–594; 257/E21.461
See application file for complete search history.

(56) References Cited

U.S. PATENT DOCUMENTS

| 6,005,270 | A | 12/1999 | Noguchi |
| 6,232,631 | B1 | 5/2001 | Schmidt et al. |
| 6,787,403 | B2 | 9/2004 | Inoue et al. |
| 2002/0017681 | A1 | 2/2002 | Inoue et al. |
| 2002/0185674 | A1* | 12/2002 | Kawashima et al. ........ 257/315 |
| 2004/0206957 | A1 | 10/2004 | Inoue et al. |
| 2005/0263767 | A1 | 12/2005 | Yamazaki et al. |

FOREIGN PATENT DOCUMENTS

| JP | 11-087544 | 3/1999 |
| JP | 11-087545 | 3/1999 |
| JP | 2002-110829 | 4/2002 |
| JP | 2002-533933 | 10/2002 |
| JP | 2003-204000 | 7/2003 |
| JP | 2003-318289 | 11/2003 |

* cited by examiner

*Primary Examiner*—Richard A. Booth
(74) *Attorney, Agent, or Firm*—Nixon Peabody LLP; Jeffrey L. Costellia

(57) ABSTRACT

The present invention provides a manufacturing method of a semiconductor device having a semiconductor nonvolatile memory element that is highly reliable and that can increase a variation of a threshold voltage. Further, the present invention provides a method for manufacturing a semiconductor device having a highly reliable semiconductor nonvolatile memory element using a large substrate. According to the present invention, sputtering using, as a target, a solid solution containing silicon that exceeds a solid solubility limit is conducted, so that a conductive film including a conductive layer of a metal element that is a main component of the solid solution and silicon particles is formed, and then, the conductive layer of the metal element is removed to expose silicon particles. Furthermore, a semiconductor device having a semiconductor nonvolatile memory element using the silicon particles as a floating gate electrode is manufactured.

28 Claims, 19 Drawing Sheets

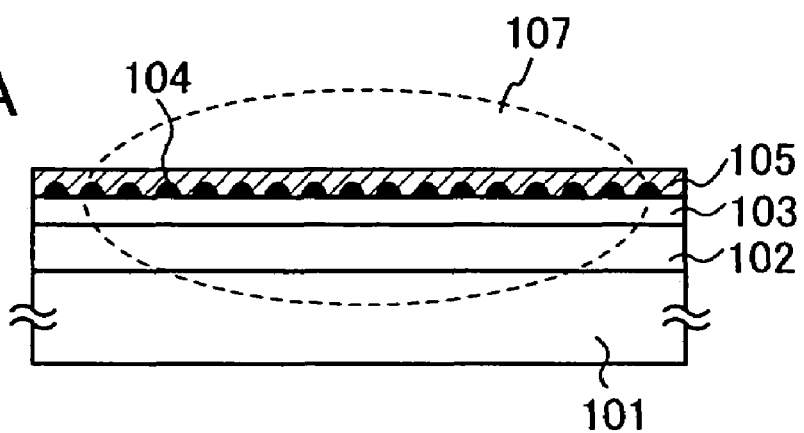
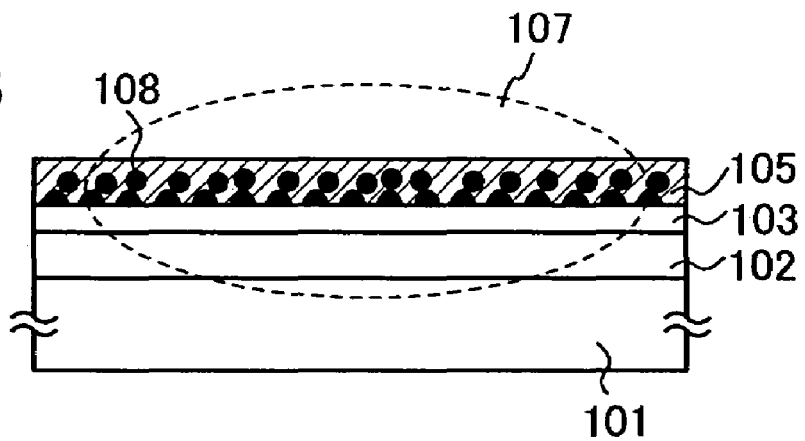
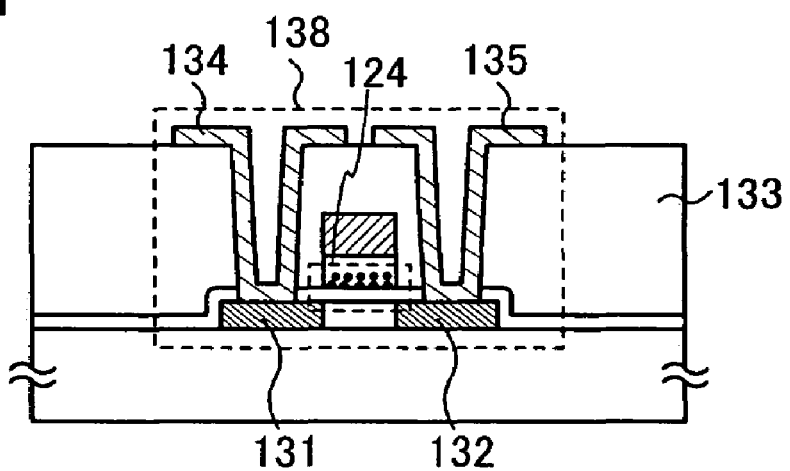

500nm

500nm

MANUFACTURING METHOD OF SEMICONDUCTOR DEVICE

BACKGROUND OF THE INVENTION

1. Field of the Invention

The present invention relates to a semiconductor device having a semiconductor nonvolatile memory element, specifically, relates to a method for manufacturing of a semiconductor device including a floating gate electrode formed with semiconductor particles.

2. Description of the Related Art

EEPROM (Electrically Erasable and Programmable Read Only Memory) and a flash memory are know n as a memory representing a semiconductor nonvolatile memory. As for the nonvolatile memory, a conductive layer serving as a charge accumulating layer or a floating gate type memory including a polysilicon layer is representative.

With recent reduction of devices in size, thinning of a tunnel oxide film of a semiconductor nonvolatile memory has been conducted. In the current situation, there is caused a defect such as a deterioration of the tunnel oxide film caused in forming films or a set of operation such as writing or erasing data (operation of injecting, holding, emitting charges, or the like). In a conventional floating gate type memory element, if a defect is caused even in one part of the tunnel oxide film, electric charges accumulated in the floating gate electrode are leaked through the defect that has become a pass, and thus the memory element cannot operate as a memory.

Reference 1 (Japanese Patent Laid-Open No. H11-87544) describes that a silicon quantum structure (hereinafter, referred to as a silicon dot) is used as a floating gate electrode instead of a conductive layer or a polysilicon layer. Here, the silicon dot is formed by a LPCVD (low pressure chemical vapor deposition).

SUMMARY OF THE INVENTION

However, in the case of the LPCVD method, a silicon dot is formed using an initial stage of silicon growth. Accordingly, there is a problem in that it is difficult to control the diameter of the silicon dot.

The silicon dot is several nm long in diameter. Thus, the number of electrons injected into each dot is small by an influence of a quantum efficiency such as Coulomb blockade phenomenon, and the variation of a threshold voltage is also small. The density of silicon dots may be increased (i.e., the number of silicon dots per unit area may be increased) so that the variation of the threshold voltage can be large. However, because silicon dots are formed on the same plane, there is a limitation on the increase of the density and thus, it is difficult to increase the variation of the threshold voltage. Although the density may be increased by stacking silicon dots three-dimensionally, formations of an oxide film for isolating silicon dots and silicon dots are to be repeated to stack silicon dots three-dimensionally, thereby increasing the number of steps. Accordingly, there is a problem in that throughput is decreased and cost is increased.

In addition, if silicon dots are made large by a LPCVD method so as not to cause a quantum efficiency such as Coulomb blockade phenomenon, adjacent dots are in contact with one another in forming the silicon dots and unified. Consequently, a highly reliable semiconductor nonvolatile memory element cannot be manufactured, because it has the same structure as a conventional semiconductor nonvolatile memory element in which a conductive layer or a polysilicon layer is a floating gate electrode.

In view of the above described problems, it is an object of the present invention to provide a manufacturing method of a semiconductor device having a semiconductor nonvolatile memory element that is highly reliable and that can increase a variation of a threshold voltage. Further, it is another object of the present invention to provide a method for manufacturing a semiconductor device having a highly reliable semiconductor nonvolatile memory element using a large substrate.

According to the present invention, sputtering using, as a target, a solid solution containing silicon that exceeds a solid solubility limit is conducted, so that a conductive film containing a conductive layer of a metal element that is a main component of the solid solution and silicon particles (silicon dots or silicon cluster) is formed, and then, the conductive layer of the metal element is removed to expose silicon particles. Further, according to the present invention, a semiconductor device having a semiconductor nonvolatile memory element using the silicon particles as a floating gate electrode (hereinafter, referred to as a memory transistor) is manufactured. In general/in this specification, the solid solubility limit means a solute concentration at a limit at which uniform solid solution is formed stably. The silicon that exceeds the solid solubility limit means silicon that exceeds the solid solubility limit to a certain metal element. The solid solubility limit at this time is a solid solubility limit at a film formation temperature. Moreover, the density of silicon particles are increased and further the diameter of the silicon particles can be uniform by forming a conductive film containing a conductive layer having a metal element and silicon particles (silicon dots or silicon cluster) while heating.

According to the present invention, sputtering using, as a target, a solid solution containing a metal element and silicon that exceeds a solid solubility limit with respect to the metal element is conducted to form a conductive film, which has silicon particles and a layer containing the metal element, over an insulating film, and then the layer of the metal element is removed to expose the silicon particles. Thus, a semiconductor device having a memory transistor using the silicon particles as a floating gate electrode can be manufactured.

In addition, according to the present invention, sputtering using, as a target, a solid solution containing a metal element and silicon that exceeds a solid solubility limit with respect to the metal element is conducted to form a conductive film, which has silicon particles and a layer containing the metal element, over an insulating film, and then the layer of the first metal element is oxidized to form a metal oxide film. Thus, a semiconductor device having a memory transistor using the silicon particles as a floating gate electrode can be manufactured.

When a melting solution containing a main component A and a sub-component B is cooled rapidly, the main component A and the sub-component B are cooled rapidly and coagulated at a speed higher than a diffusion speed of the sub-component B. Therefore, a solid solution AB in which the sub-component B that exceeds the solid solubility limit is solid-dissolved can be obtained. A sputtering reaction as the solid solution as a target is conducted, so that the sub-component B that exceeds the solid solubility limit precipitates as particles in addition to the solid solution AB. Accordingly, sputtering is conducted using, as a target, a solid solution in which silicon that exceeds the solid solubility limit is contained as the sub-component B and a metal element that can form a solid solution with silicon is contained as the main component A, so that silicon particles precipitate and a conductive layer of the metal element can be formed. The conductive layer of the metal element is removed, so that silicon particles can be formed. In addition, the silicon particles and the conductive layer of the metal element are formed in a region where a semiconductor region and a tunnel oxide film are overlapped; thus a floating gate electrode formed of silicon particles can be formed and further a memory transistor having the floating gate electrode can be formed.

By a sputtering method, a semiconductor device having a floating gate electrode of silicon particles over a large substrate can be manufactured. Accordingly, because a semiconductor device can be manufactured by cutting out a plurality of thin film integrated circuits after a thin film circuit having a memory transistor is formed using a large substrate, a large number of semiconductor devices can be manufactured once and highly reliable semiconductor devices can be manufactured at low cost.

Since silicon particles dispersed three dimensionally can be formed by a sputtering method, the density of silicon particles to serve as a charge accumulating layer can be increased. The size of a silicon particle can be increased preventing a large number of silicon particles from being unified; therefore the amount of charges injected into each particle and the variation of a threshold voltage can be increased.

In a memory transistor, a threshold voltage of the memory transistor is increased when electrons are injected into a floating gate electrode. The memory transistor has information about either 0 or 1 depending on the threshold voltage. Accordingly, a nonvolatile memory in which a margin for reading electrically can be kept wide and data breakage is difficult to be caused can be manufactured by increasing the variation of the threshold voltage.

DETAILED DESCRIPTION OF THE INVENTION

Figure 1A:
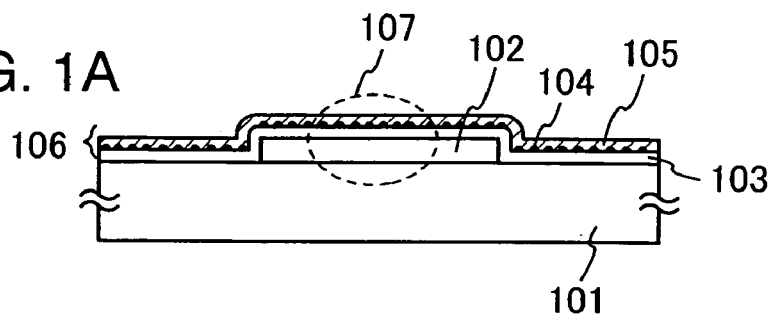
FIGS. 1A to 1E are each a cross-sectional view showing manufacturing steps of a semiconductor device according to the present invention.

Embodiment Modes according to the present invention will hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes to be given below. Note that the same reference numerals are used for the same portions through all drawings, and the description thereof is not repeated.

EMBODIMENT MODE 1

Embodiment Mode 1 describes a manufacturing process of a nonvolatile memory having silicon dots with reference to FIGS. 1A to 1E.

As shown in FIG. 1A, a semiconductor region 102 is formed over a substrate 101. Then, a first insulating film 103 is formed over the substrate and the semiconductor region. A first conductive layer 106 is formed over the first insulating film 103. The first conductive layer 106 includes silicon particles 104 and a conductive layer 105.

As the substrate 101, a glass substrate, a quartz substrate, a ceramic substrate, a plastic substrate, a stainless substrate, a synthetic resin substrate, a flexible substrate, a single crystal semiconductor substrate (typically, an n-type or p-type single crystal silicon substrate, GaAs substrate, InP substrate, GaN substrate, SiC substrate, or ZnSe substrate) and the like can be nominated. An SOI (Silicon on Insulator) substrate may also be used. In the case of using any one of these substrates, a base film (not shown) may be appropriately provided on the substrate if necessary. In this embodiment mode, the substrate including the base film is referred to as the substrate 101.

The semiconductor region 102 is formed by etching an amorphous semiconductor film, a microcrystalline semiconductor film, or a crystalline semiconductor film into a desired shape by a photolithography process and an etching process. As the amorphous semiconductor film, there is a film formed by a known method such as low pressure thermal CVD, plasma CVD, or sputtering. As the crystalline semiconductor film, there is a crystalline semiconductor film that is formed by crystallizing an amorphous semiconductor film formed by the foregoing film formation method by a laser crystallization method; a crystalline semiconductor film that is formed by crystallizing an amorphous semiconductor film formed by a known film formation method by a solid growth method; or a crystalline semiconductor film that is formed in accordance with a technique disclosed in Japanese patent publication No. 3,300,153. A semiconductor film obtained by increasing the crystallinity of such a crystalline semiconductor film by laser irradiation can also be used appropriately. Further, a crystalline semiconductor film or the like that is formed by laser-crystallizing a microcrystalline semiconductor film made from silane ($SiH_4$) may be used.

As a semiconductor material for the semiconductor film, silicon (Si) or germanium (Ge), or a compound semiconductor material such as silicon germanium alloy, silicon carbide, or gallium arsenide can be used.

In the case of laser crystallization, thermal annealing of the semiconductor film is preferably performed at 500° C. for 1 hour before crystallizing by laser irradiation to the semiconductor film in order to improve laser-resistance of the semiconductor film. By irradiating the semiconductor film with laser light of second to fourth harmonics of a fundamental wave using a solid laser capable of continuous oscillation, a large grain size crystal can be obtained. Typically, a second harmonic (532 nm) or a third harmonic (355 nm) of Nd: $YVO_4$ laser (fundamental wave 1064 nm) is preferably used. Specifically, laser light emitted from the continuous oscillation $YVO_4$ laser is converted into a higher harmonic by a nonlinear optical element to obtain laser light having a power of several W or more. The laser light is preferably emitted so as to be formed into a rectangular shape or an elliptical shape on an irradiated surface of the semiconductor film by an optical system. Here, power density of approximately 0.01 to 100 $MW/cm^2$ (preferably, 0.1 to 10 $MW/cm^2$) is preferable. The laser light is emitted at scanning rate of approximately 10 to 200 cm/sec.

As the laser, a known continuous wave gas laser or solid laser can be used. As the gas laser, an Ar laser or a Kr laser can be nominated. As the solid laser, a YAG laser, a $YVO_4$ laser, a YLF laser, a $YAlO_3$ laser, a $Y_2O_3$ laser, a glass laser, a ruby laser, an alexandrite laser, a Ti: sapphire laser, and the like can be nominated.

The pulsed laser is made to have a repetition rate of 0.5 MHz or more, preferably, 10 MHz or more. This repetition rate may be extremely higher than that of the pulsed laser used usually, which is from several tens to several hundred Hz, to conduct laser crystallization. It is said that it takes several tens to several hundred nsec. to solidify the semiconductor film completely after the semiconductor film is irradiated with the pulsed laser light. Thus, it is possible to irradiate the next pulsed laser light before the semiconductor film is solidified after it have been melted by the laser light and with the repetition rate band. Therefore, since the interface between the solid phase and the liquid phase can be moved continuously in the semiconductor film, the semiconductor film having a crystal grain grown continuously in the scanning direction is formed. Specifically, it is possible to form an aggregation of crystal grains each of which has a width of 10 to 30 μm in the scanning direction and a width of approximately 1 to 5 μm in the direction perpendicular to the scanning direction. It is also possible to form a semiconductor film having almost no crystal grain boundaries that prevent carriers of the TFT from moving by forming a crystal grain of a single crystal extending long in the scanning direction.

Further, polythiophene, poly(3-alkylthiophene), polythiophene derivatives, pentacene, or other known organic semiconductor materials can be used to form a semiconductor region.

In this embodiment mode, pulsed laser light is emitted to an amorphous semiconductor film to form a crystalline silicon film. Thereafter, channel doping may be carried out by doping $B_2H_6$ to the semiconductor film in order to control a threshold value of a transistor that is formed afterwards.

Note that a mask pattern may be formed by discharging an insulating material of organic resin, inorganic resin or the like by an ink-jet method, a droplet discharging method or the like that can discharge a material onto a desired position instead of a photolithography process, and then a semiconductor film may be etched using the mask pattern to form a semiconductor region. At the time, a minute semiconductor region can be formed by reducing the area of the mask pattern, and thus a semiconductor device in which a memory transistor is highly integrated can be manufactured.

Then, the first insulating film 103 is formed over the semiconductor region 102 and the substrate 101. The first insulating film 103 is preferably formed to have a thickness of 1 to 100 nm, more preferably, 1 to 10 nm, further more preferably, 2 to 5 nm. The first insulating film serves as a tunnel oxide film in a memory transistor to be formed later. Accordingly, a tunnel current is easier to flow as the first insulating film is thinner, and thus, high speed operation becomes possible. As the thickness of the first insulating film is more decreased, the voltage required to store charges in the floating gate electrode is lower. As a result, power consumption of a semiconductor device that is formed afterwards can be reduced.

As a method for forming the first insulating film 103, a GRTA (Gas Rapid Thermal Anneal) method, an LRTA (Lamp Rapid Thermal Anneal) method, a treatment using oxygen plasma or the like is used to oxidize the surface of the semiconductor region 102 to form a thermal oxide film, and thus the first insulating film having a thin thickness can be formed. Alternatively, a PVD (physical vapor deposition) method, a CVD (chemidal vapor deposition) method, a coating method, or the like may be used. As the first insulating film 103, a silicon oxide film or a silicon nitride film can be used. Further, the first insulating film 103 may be formed to have a stacked structure of a silicon oxide film and a silicon nitride film from the substrate 101 side, or a silicon oxide film, a silicon nitride film, and a silicon oxide film from the substrate 101 side. It is preferable to form a silicon oxide film to be in contact with the semiconductor region, because the interface state between a gate insulating film and the semiconductor region becomes low. In this embodiment mode, a silicon oxide film and a silicon nitride film are stacked to form the first insulating film 103.

The first conductive film 106 is formed over the first insulating film 103 by a sputtering method. Here, a solid solution containing silicon that exceeds solid solubility limit with respect to a metal element as a main component is used in the sputtering. As the metal element that can form a solid solution with silicon, beryllium (Be), aluminum (Al), zinc (Zn), gallium (Ga), germanium (Ge), silver (Ag), cadmium (Cd), indium (In), tin (Sn), antimony (Sb), gold (Au), lead (Pb), bismuth (Bi) and the like are given. A solid solution containing silicon that exceeds solid solubility limit at a film formation temperature and one or a plurality of the above described elements is used as a target to sputter, so that the silicon particles 104 and the conductive layer 105 having one or a plurality of the above described elements are formed. At this time, the size of the silicon particle is 10 to 50 nm, preferably 20 to 30 nm. In addition, the silicon particles 104 and the conductive layer 105 having the above described elements are formed while heating the substrate, thereby increasing the density of silicon particles and the diameter of the silicon particle.

Figure 4A:
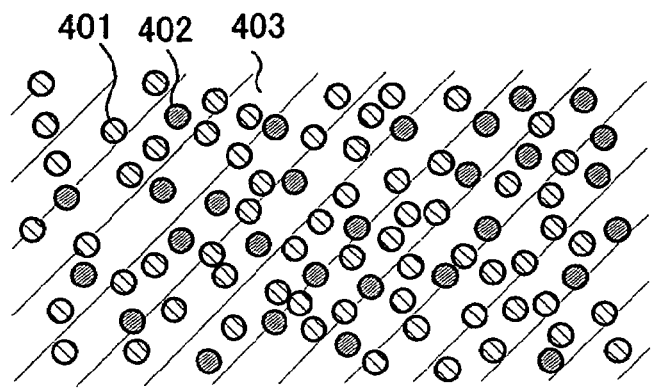
FIGS. 4A to 4D are each a top view showing a mode of forming a conductive film according to the present invention.

Herein, the principle that silicon particles 104 and the conductive layer 105 having the above described metal element are formed is shown with reference to FIGS. 4A to 4D. FIG. 4A shows a substrate at an initial stage of sputtering. Metal element particles 401 and silicon particles 402 precipitate on a substrate 403 in FIG. 4A. Note that silicon is solid-dissolved in the metal element particles 401; however silicon that exceeds solid solubility limit precipitates as the silicon particles 402.

Figure 4B:
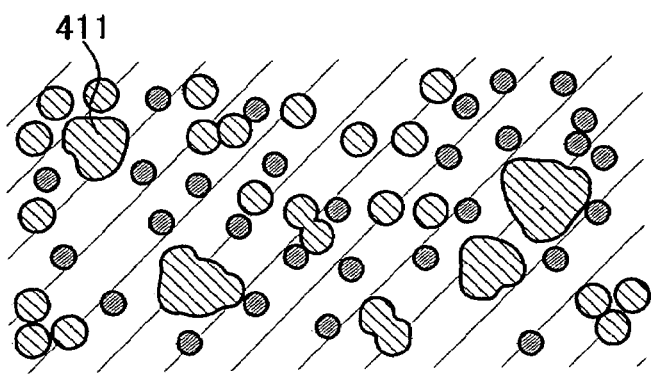

Herein, sputtering is conducted while heating the substrate 403, and thus the metal element particles are grown on the surface of the substrate 403, as shown by reference numeral 411 in FIG. 4B. When the melting point of the metal element is lower than that of silicon, the metal element particles are grown selectively.

Figure 4C:
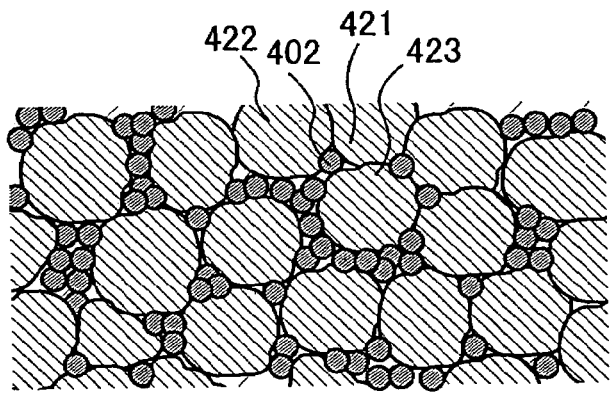

As shown in FIG. 4C, when the metal particles are more grown, the metal particles 421 to 423 become adjacent with one another. At this time, silicon particles segregate in the grain boundary of the metal particles. Further, the metal element particles are grown to form a conductive layer by continuing sputtering. As the result thereof, a conductive film formed from silicon particles and the conductive layer is formed.

Figure 4D:
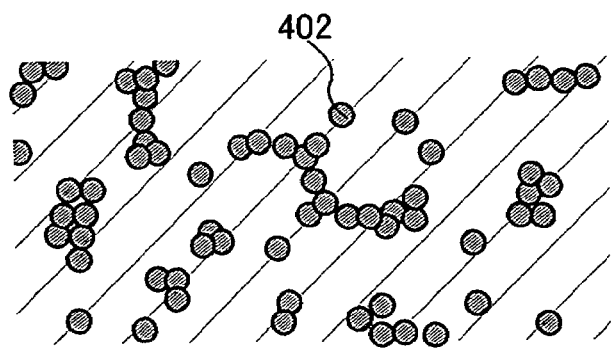

As shown in FIG. 4D, the silicon particles 402 can be formed on the substrate by removing the metal element layer.

Figure 10A:
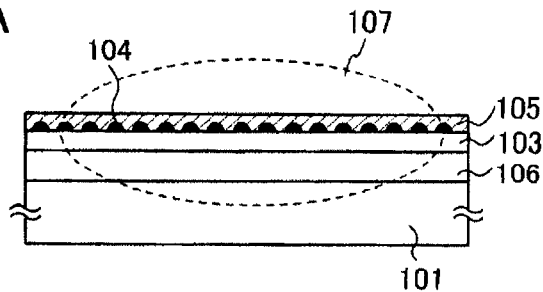
FIGS. 10A and 10B are each a cross-sectional view showing manufacturing steps of a semiconductor device according to the present invention.
Figure 10B:
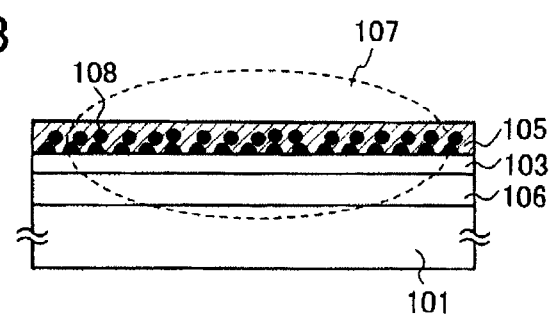

Enlarged views of the first conductive film shown in FIG. 1A and a vicinity 107 thereof are shown in FIGS. 10A and 10B. In FIG. 10A, silicon particles 104 are formed two-dimensionally, in other words, all silicon particles are formed to be in contact with the first insulating film. In addition, as shown in FIG. 10B, silicon particles 108 are formed three-dimensionally, in other words, first silicon particles are formed to be in contact with the first insulating film and second silicon particles are formed to be in contact with the first silicon particles. In FIGS. 10A and 10B, the silicon particles are formed on the first insulating film side. In this embodiment mode, silicon particles in FIGS. 10A and 10B can be selected appropriately. In Embodiment Mode 1, silicon particles that are dispersed two-dimensionally are formed. Further, an aluminum-silicon alloy is used as a target to form a conductive film of silicon particles and an aluminum layer.

When the silicon particles 104 and the conductive layer 105 of the metal element are formed while heating the substrate, the density of the silicon particles is increased and the diameter of the silicon particles is increased. In this case, the substrate temperature is 300° C. or lower, preferably 250° C. or lower. If the substrate temperature is 300° C. or higher, a hillock is generated. This hillock breaks the first insulating layer 103 to serve as a tunnel oxide film, thereby charge retention of a memory transistor is influenced.

The substrate temperature is preferably 100° C. or higher, more preferably 125° C. or higher. This is because the diameter of silicon particle is small and retention capacitance of charges is small when the substrate temperature is low.

Figure 1B:
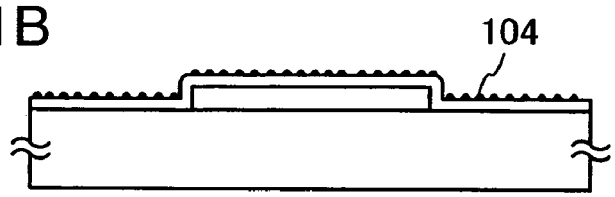

As shown in FIG. 1B, the conductive layer 105 of a first conductive film is removed. Here, a method for selectively removing the conductive layer, typically a wet etching method is preferably used. Thus, the silicon particles 104 and the first insulating film 103 can be exposed.

Figure 1C:
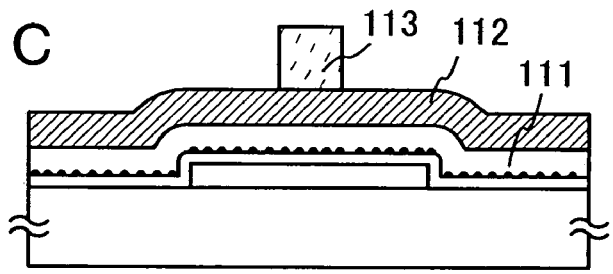

As shown in FIG. 1C, a second insulating film 211 and a second conductive film 112 are formed over the silicon particles 104 and the first insulating film 103. A mask pattern 113 is formed over the second conductive film 112.

The second insulating film 111 is preferably 1 to 100 nm thick, more preferably 10 to 70 nm thick, most preferably 10 to 30 nm thick. The second insulating film 111 is required to insulate a floating gate electrode to be formed later from a gate electrode to be formed later in a memory transistor. Accordingly, the insulating film 211 is preferably thick enough that leak current is not increased between the floating gate electrode and the gate electrode. The second insulating film 111 can be formed using a silicon oxide film or a silicon nitride film similarly to the first insulating film 103. The second insulating film 111 may have a stacked structure such as a structure of a silicon oxide film and a silicon nitride film or a structure of a silicon oxide film, a silicon nitride film and a silicon oxide film. Here, a 10-nm thick silicon oxide film and a 20 nm silicon nitride film are stacked as the second insulating film 111.

After the second insulating film is formed, a conductive film containing silicon particles is formed; the conductive layer of a metal element is removed as shown in FIG. 1B; then a third insulating film is formed and a second insulating layer containing silicon particles may be formed. In addition, a plurality of insulating films containing silicon particles that are stacked may be formed by repeating the same steps. In this case, a memory transistor to be formed later has a plurality of floating gate electrodes.

The second conductive film 112 can be formed by a known method such as a sputtering method, a vapor deposition method, a CVD method. The second conductive film can be formed using an element selected from tantalum (Ta), tungsten (W), titanium (Ti), molybdenum (Mo), aluminum (Al), chrome (Cr), and neodymium (Nd), or an alloy material or a compound material containing such elements as a main component. Alternatively, the second conductive film 112 can be formed with a semiconductor film doped with an impurity element. Here, an aluminum thin film is formed by a sputtering method as the second conductive film.

The mask pattern 113 can be formed by a known photolithography process. Alternatively, the mask pattern may be formed by the method used in forming the semiconductor region 102. Further, the mask pattern formed by such a method is thinned by slimming with ashing or the like, thereby narrowing the width of the mask pattern. Consequently, a TFT having a short channel structure in which a gate electrode to be formed later has a narrow width can be formed, and the TFT can operate at high speed. Note that the mask pattern 113 is a mask pattern for forming a gate electrode later. For this reason, the mask pattern is not necessarily required if the gate electrode is formed by a droplet discharging method.

Figure 1D:
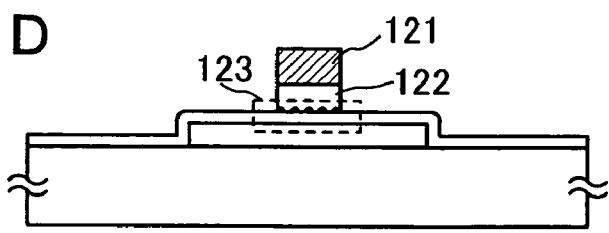

As shown in FIG. 1D, a gate electrode 121 is formed by etching the second conductive film 112 using the mask pattern 113. The second insulating film 111 is etched to form a second insulating layer 122 and to expose the silicon particles 104. Then, the silicon particles 104 are etched and thus a floating gate electrode 123 of silicon particles is formed. The second conductive film 112, the first insulating film and the silicon particles 104 are etched by a known etching method such as a wet etching method or a dry etching method. Note that there is a risk that a defect is generated in the first insulating film 103 due to a plasma impact of the dry etching, if the first insulating film 103 on which the silicon particles 104 are formed has a thin film thickness. Accordingly, wet etching is preferable in removing them. Here, the silicon particles are removed by a wet etching method using $NMD_3$ solution (water solution including tetramethyl ammonium hydro oxide of 0.2 to 0.5%) or the like.

The gate electrodes are formed to have thicknesses of 0.2 to 1.5 μm, preferably 0.2 to 0.7 μm. By setting the width of the gate electrode within the range, a memory transistor having a short channel length can be formed, and a semiconductor device capable of operating at high speed can be manufactured.

The floating gate electrode is formed with dispersed particles. Therefore, if a defect is generated in the first insulating film to serve as a tunnel oxide film, all charges accumulated in the floating gate electrode can be prevented from flowing into the semiconductor region through the defect. Consequently, a highly reliable memory transistor can be formed.

Figure 1E:
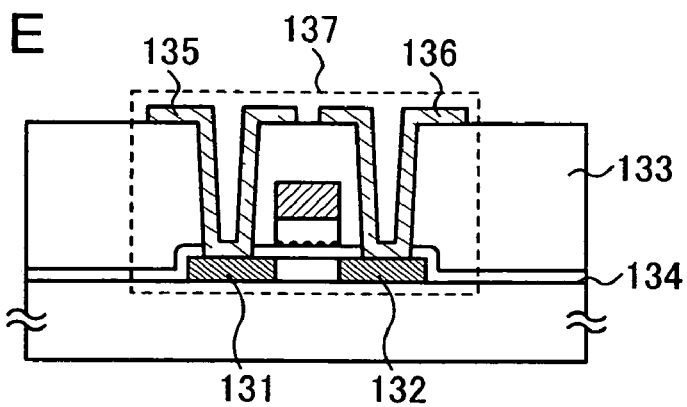

As shown in FIG. 1E, an impurity element imparting an n-type or p-type conductivity is added into the semiconductor region 102 using the gate electrode 121 as a mask as shown in FIG. 1E. An insulating film (not shown) is formed and the impurity element is activated by a heat treatment, GRTA, LRTA or the like to form source and drain regions 131 and 132. Thereafter, an inorganic insulating film containing a silicon nitride film may be formed over the first insulating film and the gate electrode and a heat treatment may be performed. By forming the inorganic insulating film in such a way that the inorganic insulating film contains hydrogen and performing the heat treatment, hydrogenation for terminating dangling bonds in each semiconductor region can be conducted.

A third insulating film serving as an interlayer insulating film is formed. The third insulating film can be formed by using organic resin having heat resistance such as polyimide, acrylic, and polyamide. In addition to the foregoing organic resin, a low dielectric constant material (low-k material), resin including a Si—O—Si bond formed by a siloxane based material as a starting material (hereinafter, siloxane based resin), or the like can be used. The siloxane based resin may have at least an organic group containing hydrogen (e.g., an alkyl group and aromatic hydrocarbon) as a substituent. In addition, a fluoro group may be contained as the substituent. Further, an organic group containing hydrogen and a fluoro group may be contained at least as the substituent. The third insulating film can be formed by a spin coating method, a dipping method, a spray coating method, a droplet discharging method such as an ink-jet method, a screen printing method or an offset printing method, a doctor knife, a roll coater, a curtain coater, a knife coater, a CVD method, a vapor deposition method, or the like depending on the material. In addition, an inorganic material may be used, and in this case silicon oxide, silicon nitride, silicon oxynitride, PSG (phosphorous glass), BPSG (boron phosphorous glass), or an alumina film can be used. The third insulating film may be formed by stacking these insulating films. Here, the third insulating film is formed by coating and baking an acrylic film.

Contact holes are formed by etching a part of the third insulating film and a part of the first insulating film 103 by a photolithography process and an etching process to expose a part of the source and drain regions. At this time, the etched third insulating film is referred to as a third insulating layer 133, and the etched first insulating film is referred to as a first insulating layer 134. Here, a flat surface insulating film is illustrated as the third insulating layer 133; however, the third insulating layer 133 is not required to be flat.

Source and drain electrodes 135 and 136 connected to the source and drain regions are formed to form a memory transistor 137. The source and drain electrodes can be formed by forming a conductive film by a PVD (Physical Vapor Deposition) method, a CVD (Chemical Vapor Deposition) method, a vapor deposition method, or the like and etching the conductive film into a desired shape. A conductive layer can be formed selectively at a predetermined position by a droplet discharging method, a printing method, an electroplating method, or the like. Moreover, a reflow method or a damascene method may be used. As a material for the source and drain regions, metal such as Ag, Au, Cu, Ni, Pt, Pd, Ir, Rh, W, Al, Ta, Mo, Cd, Zn, Fe, Ti, Si, Ge, Zr or Ba an alloy of such metals; or a metal nitride of such a metal can be used. Alternatively, the source and drain regions may be formed to have a stacked structure of the foregoing materials.

Figure 11:
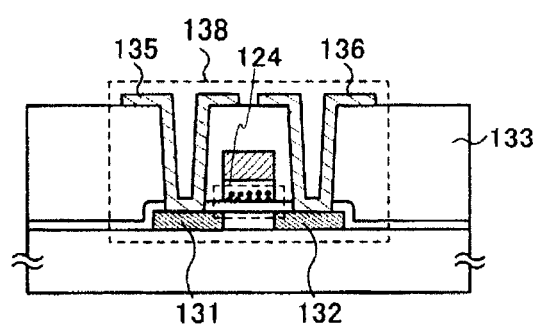
FIG. 11 is a cross-sectional view of a semiconductor device according to the present invention.

When silicon particles dispersed three-dimensionally in the first conductive layer are formed, the memory transistor 138 having a floating gate electrode 124 dispersed with silicon particles three-dimensionally can be formed as shown in FIG. 11.

The memory transistor can be separated from the substrate 101 shown in FIGS. 1A to 1E by the following method. The separation method, for example, as follows: 1. a substrate having heat resistance to about 300 to 500° C. is used as the substrate 101, a metal oxide film is formed between the substrate 101 and the memory transistors 137 and 138, and the metal oxide film is weakened by crystallization to separate the memory transistors; 2. an amorphous silicon film containing hydrogen is provided between the substrate 101 and the memory transistors 137 and 138, and irradiated with laser light or etched using a gas or a solution to remove the amorphous semiconductor film to separate the memory transistors; 3. the substrate 101 in which the memory transistors 137 and 138 are formed is removed mechanically or by etching using a solution or a gas of $CF_3$ or the like to separate the memory transistors. In addition, attachment of the separated memory transistors onto a flexible substrate may be conducted with a commercial adhesive agent. For example, an epoxy resin based adhesive agent or an adhesive agent of resin additives or the like may be used.

As described above, the separated memory transistor is attached onto a flexible substrate, and therefore a semiconductor device, which is thin and light but not breakable when it is dropped, can be provided. In addition, since a flexible substrate has flexibility, it is possible to attach the flexible substrate onto a curved surface or a deformed shape, thereby realizing various applications. If the substrate 101 is reused, a semiconductor device can be provided at low cost.

Through the above described steps, the memory transistor 137 having the semiconductor region 102, the first insulating layer 134 serving as a tunnel oxide, the floating gate electrode 123, the second insulating layer 122 and the gate electrode 121 can be formed. In addition, as shown in FIG. 11, the memory transistor 138 having the semiconductor region 102, the first insulating layer 134 serving as a tunnel oxide, the floating gate electrode 124, the second insulating layer 122 and the gate electrode 121 can be formed.

It is possible to form respective semiconductor devices by using a large substrate as the substrate 101, forming a plurality of circuit patterns of the semiconductor devices through the above described steps and isolating the circuit patterns into rectangular shapes. Therefore, the cost can be reduced at this point.

Moreover, a thin semiconductor device can be manufactured by separating the memory transistor manufactured in this embodiment mode from a substrate and attaching onto a flexible substrate.

According to this embodiment mode, a semiconductor device having a floating gate electrode of silicon particles over a large substrate can be manufactured by a sputtering method. Accordingly, because a semiconductor device can be manufactured by cutting out a plurality of thin film integrated circuits after a thin film circuit having a memory transistor is formed using a large substrate, semiconductor devices can be manufactured at lower cost.

Since silicon particles dispersed three-dimensionally can be formed by a sputtering method, the density of silicon particles to serve as a charge accumulating layer can be increased and the variation of a threshold voltage can be increased.

The size of a silicon particle can be increased preventing a large number of silicon particles from being unified; therefore the amount of charges injected into each particle and the variation of a threshold voltage can be increased.

The floating gate electrode of the memory transistor is formed with dispersed particles. Therefore, accumulated charges can be prevented from flowing out due to a defect in the tunnel oxide film. Consequently, a highly reliable memory transistor can be formed.

EMBODIMENT MODE 2

Embodiment Mode 2 describes a manufacturing method of a memory transistor in which an insulating film is formed by oxidizing a conductive layer over silicon particles as in Embodiment Mode 1 with reference to FIGS. 2A to 2E.

Figure 2A:
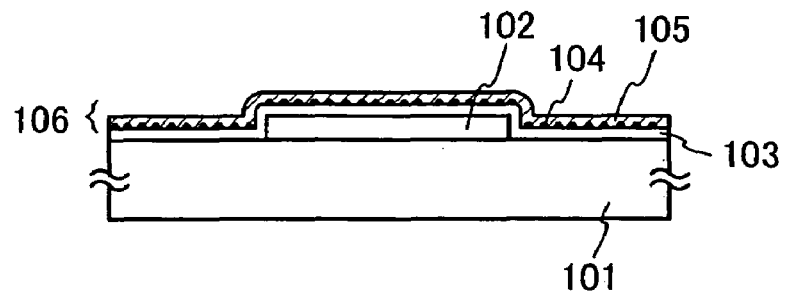
FIGS. 2A to 2E are each a cross-sectional view showing manufacturing steps of a semiconductor device according to the present invention.

As shown in FIG. 2A, a semiconductor region 102 and a first insulating film 103 are formed over a substrate 101 according to Embodiment Mode 1. Then, a first conductive film 106 containing silicon particles 104 and a conductive layer 105 is formed over the first insulating film 103 by a sputtering method. Here, a solid solution containing silicon that exceeds solid solubility limit with respect to a metal element is used as a target in the sputtering. As the metal element that can form a solid solution with silicon, metal elements such as berylium (Be), aluminum (Al), zinc (Zn), gallium (Ga), germanium (Ge), silver (Ag), cadmium (Cd), indium (In), tin (Sn), antimony (Sb), lead (Pb) and bismuth (Bi), which are solid-dissolved with silicon and are easily oxidized, are given.

Figure 2B:
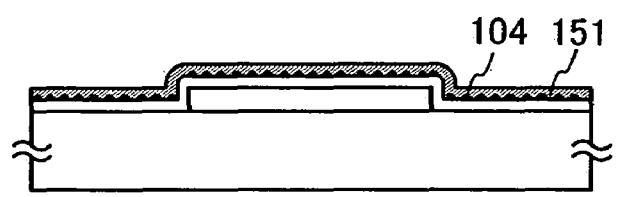

As shown in FIG. 2B, the conductive layer 105 is oxidized to form a second insulating film 151 made from a metal oxide film. The second insulating film 151 can be formed by oxidizing the conductive layer 105 by a heat treatment, a GRTA method, an LRTA method, an anodic oxidation method or the like.

Figure 2C:
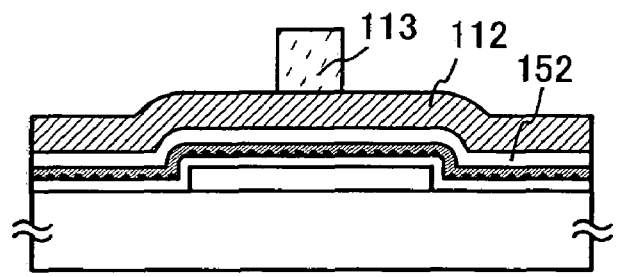

As shown in FIG. 2C, a third insulating film 152 and a second conductive film 112 are formed over the second insulating film 151, and a mask pattern 113 is formed on the second conductive film 112. The third insulating film 152 can be formed using the same material and method as the second insulating film 111 in Embodiment Mode 1.

In this embodiment mode, the second insulating film is formed over the metal oxide film; however, if the surface of the metal oxide film is completely oxidized and insulated, the second insulating film is not required to be formed anew. In this case, because the metal oxide film insulates the floating gate electrode from the gate electrode, the number of steps can be reduced.

Figure 2D:
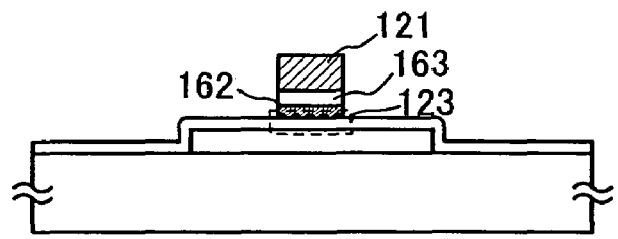
Figure 2E:
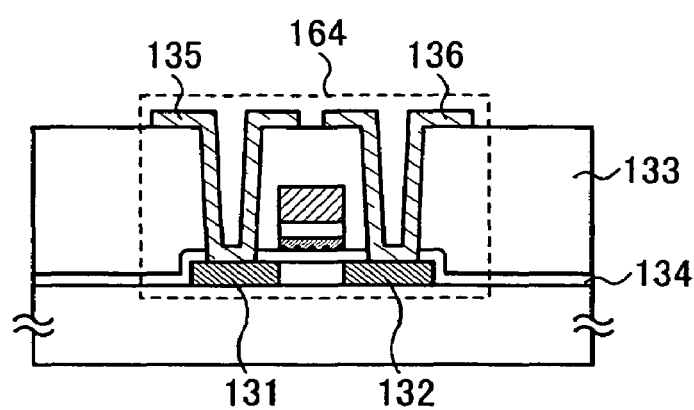

As shown in FIG. 2D, a gate electrode 121 is formed by etching the second conductive film 112 using the mask pattern 113. The third insulating film 152 and the second insulating film 151 are each etched to form a third insulating layer 163 and a second insulating layer 162 and at the same time, to expose silicon particles 104. Note that the second insulating film 151 that has been etched is referred to as a second insulating layer 162 and the third insulating film 152 that has been etched is referred to as a third insulating layer 163. The silicon particles 104 are etched to form the floating gate electrode 123 containing silicon particles. The second insulating film is etched by a known etching method such as wet etching or dry etching similarly to the third insulating film.

After that, a third insulating layer 133, source and drain electrodes 135 and 136 are formed according to the same process as in Embodiment Mode 1 to form a memory transistor.

Through the above described steps, a memory transistor 164 having the semiconductor region 102, a first insulating layer 134 serving as a tunnel oxide, the floating gate electrode 123, the second insulating layer 162, the third insulating layer 163 and the gate electrode 121 can be formed.

A large substrate is used as the substrate 101 as in Embodiment Mode 1 and a plurality of circuit patterns of the semiconductor devices are formed through the above described steps, and then the circuit patterns are isolated into rectangular shapes to form respective semiconductor devices. Therefore, the cost can be reduced at this point.

Moreover, a thin semiconductor device can be manufactured by separating the memory transistor manufactured in this embodiment mode from a substrate and attaching onto a flexible substrate.

Since silicon particles dispersed three dimensionally can be formed by a sputtering method, the density of silicon particles to serve as a charge accumulating layer can be increased and the variation of a threshold voltage can be increased.

The size of a silicon particle can be increased preventing a large number of silicon particles from being unified; therefore the amount of charges injected into each particle and the variation of a threshold voltage can be increased.

The floating gate electrode of the memory transistor is formed with dispersed silicon particles. Therefore, accumulated charges can be prevented from flowing out due to a defect in the tunnel oxide film. Consequently, a highly reliable memory transistor can be formed.

EMBODIMENT MODE 3

Embodiment Mode 3 describes a manufacturing process of a memory transistor formed with different masks for a gate electrode and a floating gate electrode with reference to FIGS. 3A to 3E.

Figure 3A:
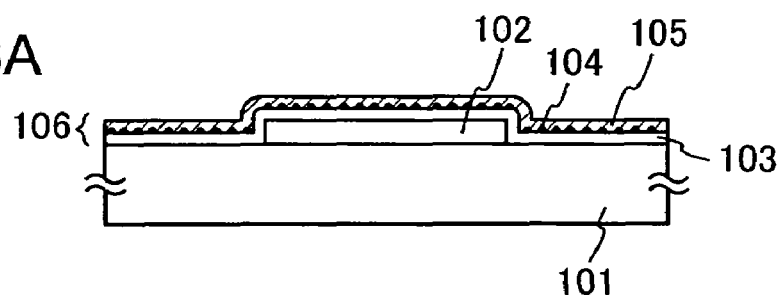
FIGS. 3A to 3E are each a cross-sectional view showing manufacturing steps of a semiconductor device according to the present invention.
Figure 3B:
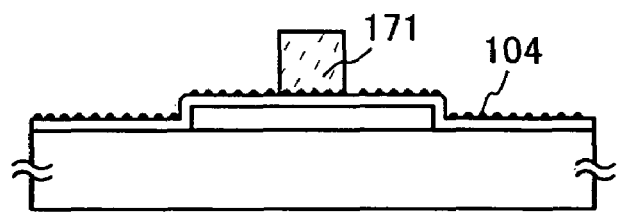

As shown in FIG. 3A, a semiconductor region 102 and a first insulating film 103 are formed over a substrate 101 according to Embodiment Mode 1. Then, a first conductive film 106 containing silicon particles 104 and a conductive layer 105 is formed over the first insulating film 103 by a sputtering method. As shown in FIG. 3B, the conductive layer 105 is removed as in Embodiment Mode 1 to expose silicon particles. A first mask pattern 171 is formed over the silicon particles 104 and the first insulating film 103. The first mask pattern 171 is a mask pattern for forming a floating gate electrode later.

Figure 3C:
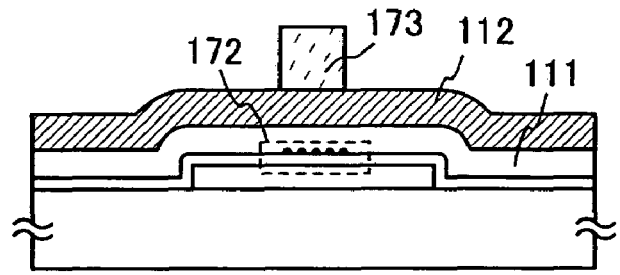

The silicon particles are etched using the first mask pattern 171 to form a floating gate electrode 172 of silicon particles as shown in FIG. 3C. A second insulating film 111 and a second conductive film 112 are formed over the floating gate electrode 172 and the first insulating film 103. Then, a second mask pattern 173 is formed over the second conductive film 112. The second mask pattern 173 is formed in order to form a gate electrode later.

Figure 3D:
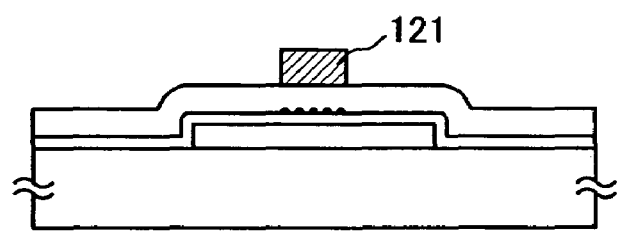

As shown in FIG. 3D, the second conductive film 112 is etched using the mask pattern 173 to form the gate electrode 121. At the time, the second insulating film 111 may be etched.

Figure 12A:
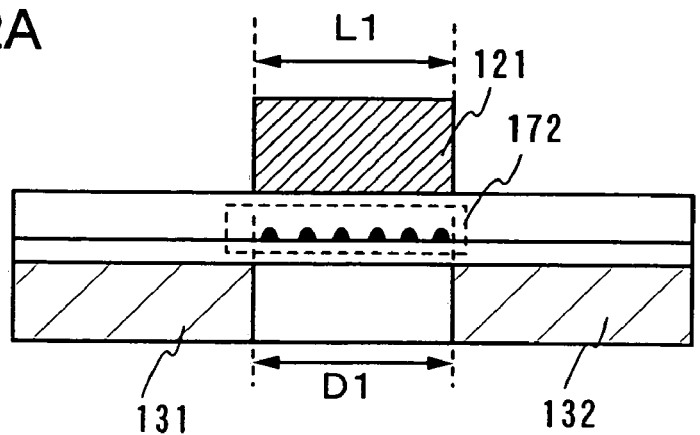
FIGS. 12A to 12D are each a cross-sectional view of a semiconductor device according to the present invention.

Herein, the positional relation of edge portions of the gate electrode 121 and the floating gate electrode 172 is described with reference to FIGS. 12A to 12D. In FIGS. 12A to 12D, widths of the gate electrodes 121 are each represented by L1 to L3, whereas widths of the floating gate electrodes are each represented by D1 to D3. FIG. 12A shows that a memory transistor in which the width L1 of the gate electrode 121 and the width D1 of the floating gate electrode 172 are equal to each other, that is, the both edge portions of the gate electrode and the both edge portions of the floating gate electrode 172 basically match each other.

Figure 12B:
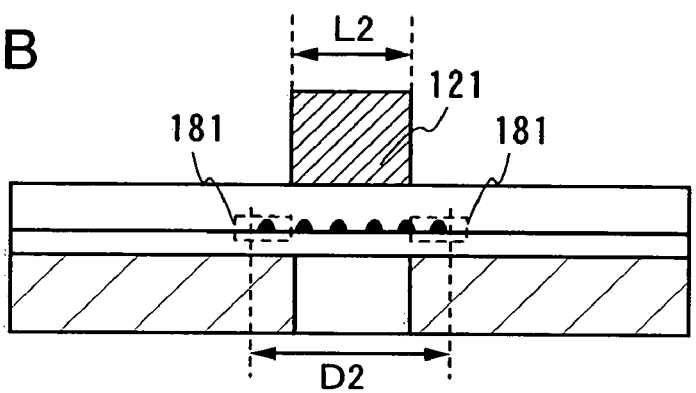

In FIG. 12B, a memory transistor in which the width D2 of the floating gate electrode 172 is larger than the width L2 of the gate electrode 121, that is, the both edge portions of the floating gate electrode are positioned outside the both edge portions of the gate electrode is illustrated. In this case, floating gate electrodes 181, which are provided outside the gate electrode 121, serve as floating gate electrodes, because charges are accumulated when applied with voltage from source and drain regions. Therefore, either the structure in which both edge portions of the floating gate electrode 172 are outside the edge portions of the gate electrode 121 (FIG. 12B) or the structure in which the both edge portions of the gate electrode and those of the floating gate electrode correspond to each other (FIG. 12A) may be appropriately selected so that the structure will be favorable to an operation method, a manufacturing process or miniaturization of a memory transistor.

Figure 12C:
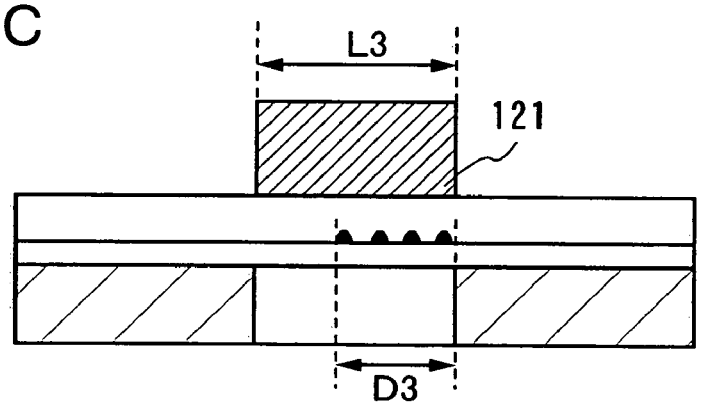
Figure 12D:
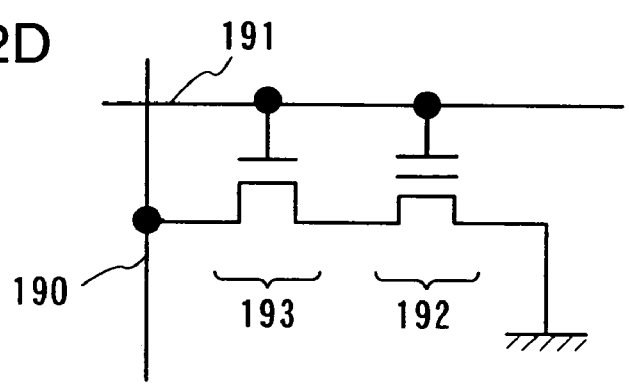

FIG. 12C shows a memory transistor in which a width D3 of the floating gate electrode 172 is smaller than a width L3 of the gate electrode 121. In this case, the memory transistor has a so-called split gate electrode structure. The split gate electrode structure refers to an element that constructs a selecting transistor for selecting a memory transistor and the memory transistor in one semiconductor region 102 and one gate electrode 121. It is a structure that a pair of a signal line 190 and a scanning line 191 controls a memory transistor 192 and a selecting transistor 193 as shown in FIG. 12D. Even when the memory transistor becomes an excessive erasing state (negative threshold voltage state), such a structure can keep the selectivity of a memory cell by virtue of the selecting transistor 193, and thus the structure has a favorable operation margin. FIG. 12C shows a structure in which one edge of the floating gate electrode coincides with an edge of the gate electrode; however, the present invention is not limited thereto. The both edge portions of the floating electrode 172 can be provided within the both edge portions of the gate electrode 121.

As described above, a memory transistor having various structures can be formed by appropriately controlling the positions of the gate electrode and the floating gate electrode.

Figure 3E:
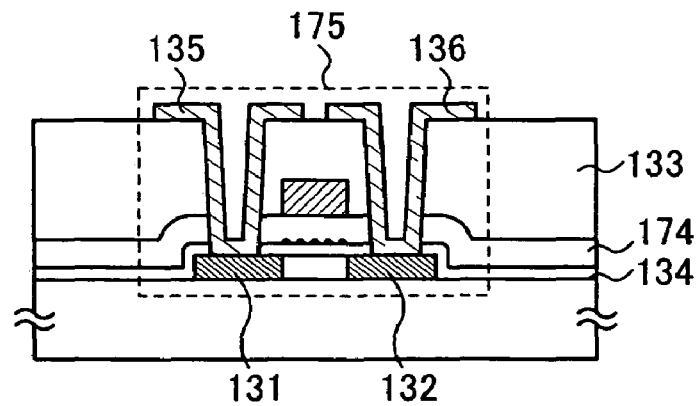

After that, as shown in FIG. 3E, a third insulating layer 133, and source and drain electrodes 135 and 136 are formed according to the same process as in Embodiment Mode 1 to form a memory transistor 175. Note that a second insulating film 111 that has been etched in forming a contact hole is referred to as a second insulating layer 174.

Through the above described steps, the memory transistor 175 having a semiconductor region 102, a first insulating layer 134 serving as a tunnel oxide film, a floating gate electrode 172, a second insulating layer 174 and a gate electrode 121 can be formed.

Note that Embodiment Mode 3 is described using Embodiment Mode 1; however, Embodiment Mode 3 can be combined with Embodiment Mode 2.

EMBODIMENT 1

Figure 13A:
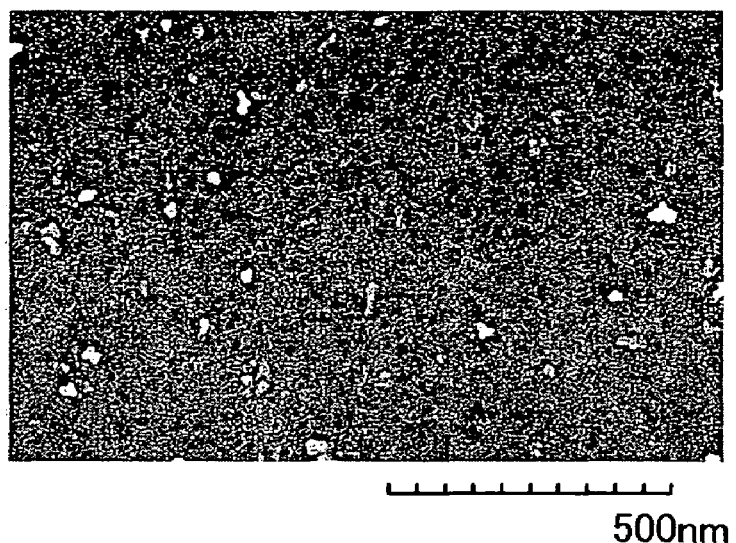
FIGS. 13A and 13B are each a top view showing particles formed according to the present invention.
Figure 13B:
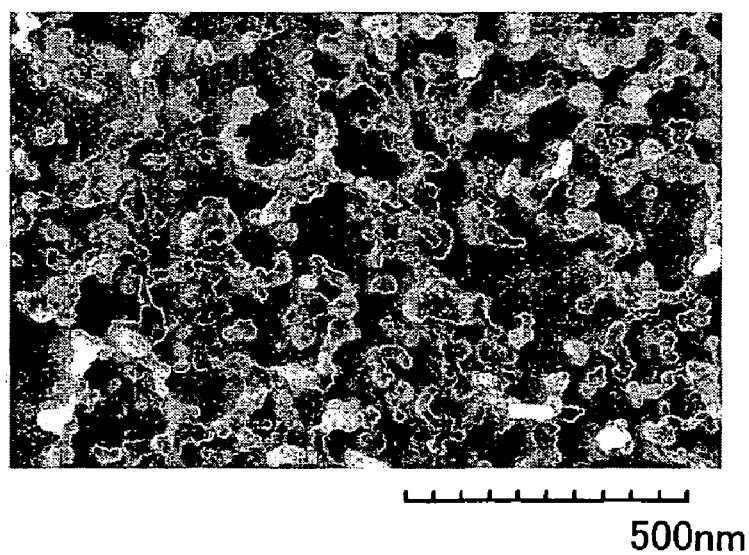

Embodiment 1 describes silicon particles obtained by forming a conductive film containing silicon particles and an aluminum layer over a glass substrate and removing the aluminum layer with reference to FIGS. 13A and 13B.

An aluminum-silicon film of 350 nm thick is formed by a sputtering method over a glass substrate. The aluminum-silicon film is formed under the conditions that an aluminum alloy containing Si of 2 wt % is used as a target, argon is used as a sputtering gas, the pressure is 0.4 PA and the electric power is 4 kw. At this time, in the aluminum-silicon film, silicon particles precipitate on the surface of a substrate and an aluminum layer is formed thereon.

The maximum solid solubility limit of silicon to aluminum is 1.65 wt % in 850 K (Metal Handbook edited by The Japan Institute of Metals, Sixth edition, Maruzen. Co. ltd, p. 566, May, 30, 2000), and the solid solubility limit decreases except at this temperature. An aluminum alloy containing silicon with a concentration higher than the solid solubility limit at 150° C. (2 wt %) is used as a target to sputter, and thus silicon particles precipitate.

The aluminum layer is dissolved with aluminum mixed acid to expose silicon particles. SEM (scanning electron microscope) photographs of samples in this case are shown in FIGS. 13A and 13B. Note that a surface of each sample is provided with a platinum thin film of several nm thick for easy observation with SEM. FIG. 13A is a SEM photograph showing the sample in which an aluminum-silicon film was formed at room temperature (25° C.) as a substrate temperature. It can be observed that silicon particles are dispersed.

On the other hand, FIG. 13B is a SEM photograph showing the sample in which an aluminum-silicon film is formed while heating the substrate (here, about at 150° C.). It can be observed that silicon particles are dispersed on the substrate side three dimensionally. Further, silicon particles having the uniform diameter can be obtained with a high density by forming them while heating the substrate.

EMBODIMENT 2

Embodiment 2 describes a manufacturing method of a memory transistor formed on the surface of an insulating substrate with reference to FIGS. 5A to 5E. In this embodiment, the memory transistor has a single drain structure.

Figure 5A:
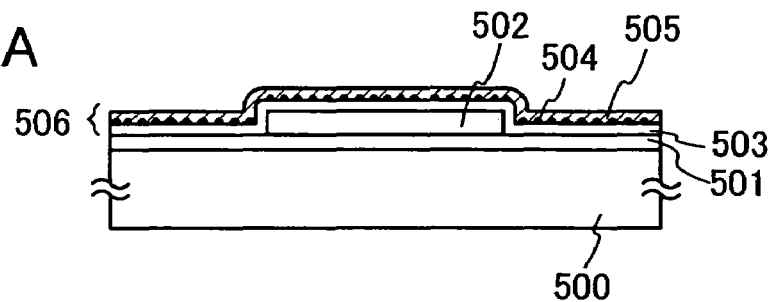
FIGS. 5A to 5E are each a cross-sectional view showing manufacturing steps of a semiconductor device according to the present invention.

As shown in FIG. 5A, a first insulating film 501 is formed over a glass substrate 500. The insulating film 501 serves as a blocking film for preventing an impurity element of the substrate from entering a semiconductor region to be formed later. Accordingly, a base film formed from an insulating film such as a silicon oxide film, a silicon nitride film or a silicon oxynitride film is formed as the first insulating film 501. Further, a silicon oxide film and a silicon nitride film may be formed continuously.

An amorphous silicon film is formed over the first insulating film 501. A crystalline silicon film is formed by emitting pulsed laser light having a frequency of 80 MHz to the amorphous silicon film. Then, the crystalline silicon film is etched into a desired shape by a photolithography process and an etching process to form a semiconductor region 502.

A second insulating film 503 is formed over the semiconductor region 502. Here, the second insulating film 503 is formed by continuously forming a silicon oxide film and a silicon nitride film. A first conductive layer 506 containing silicon particles 504 and an aluminum layer is formed by a sputtering method. The first conductive film is formed under the conditions that an aluminum alloy containing Si of 2 wt % (Al—Si alloy) is used as a target, argon is used as a sputtering gas, the pressure is 0.4 PA, the electric power is 4 kw, and the substrate is heated at 150° C.

Figure 5B:
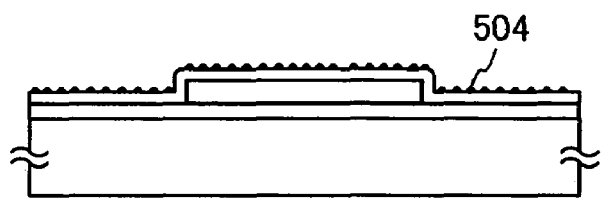

An aluminum layer 505 is etched with aluminum mixed acid to expose the silicon particles 504 as shown in FIG. 5B.

Figure 5C:
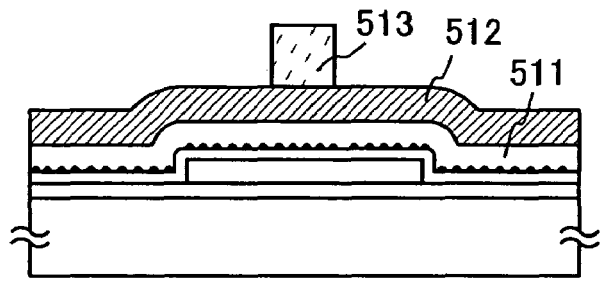

As shown in FIG. 5C, a third insulating film 511 is formed over the second insulating film 503 and the silicon particles 504.

A second conductive film 512 is formed over the third insulating film 511. The third insulating film 511 and the second conductive film 512 can each be formed using the same materials and methods as the second insulating film 111 and the second conductive film 112 in Embodiment Mode 1. Then, a mask pattern 513 is formed over the second conductive film 512.

The second conductive film 512 is etched using the mask patter 513 to form a gate electrode 521. Then, a third insulating layer 522 is formed by etching the third insulating film 511. A floating gate electrode 523 of silicon particles is formed by etching the silicon particles 504. Here, the second conductive film 512 and the third insulating film 511 are etched by a dry etching method. The silicon particles 504 are etched by a wet etching method. Here, the silicon particles are removed by a wet etching method using $NMD_3$ solution (water solution including tetramethyl ammonium hydro oxide 0.2 to 0.5%) or the like.

Figure 5D:
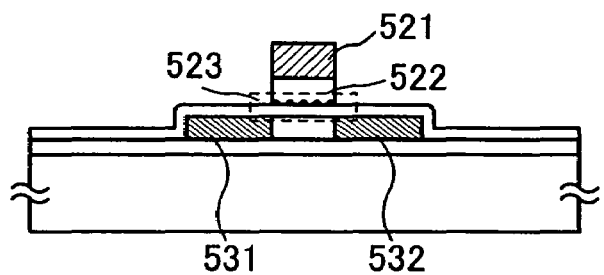
Figure 5E:
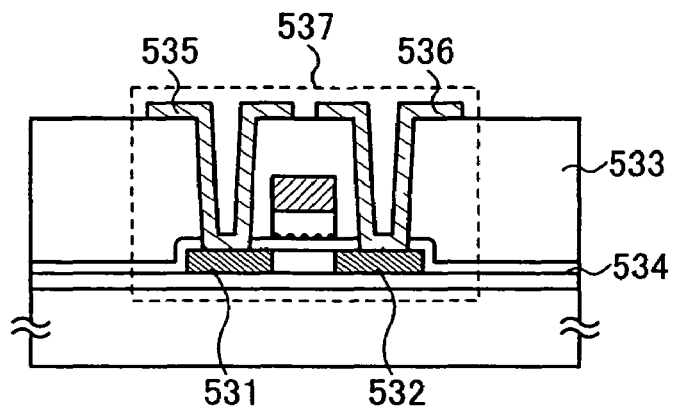

The semiconductor region 502 is doped with an impurity element in a self-alignment manner with the mask pattern 513 and the gate electrode 521 as masks. Then, the mask pattern 513 is removed and then, the impurity element is activated by by a heat treatment, a GRTA method, an LRTA method, or the like to form source and drain regions 531 and 532 as shown in FIG. 5D As shown in FIG. 5E, a fourth insulating film is formed. Then, parts of the fourth insulating film and the second insulating film 503 are etched to form a contact hole and to expose a part of the source and drain regions simultaneously. Herein, the fourth insulating film that has been etched is referred to as a fourth insulating layer 533 and the second insulating film that has been etched is referred to as a second insulating layer 534. After that, source and drain electrodes 535 and 536 to be connected to the source and drain regions are formed.

Through the above described steps, a memory transistor 537 including the semiconductor region 502, the second insulating layer 534 serving as a tunnel oxide film, the floating gate electrode 523, the third insulating layer 522, and the gate electrode 221 can be formed.

This embodiment can be freely combined with Embodiment Modes 1 to 3 and Embodiment 1.

EMBODIMENT 3

Embodiment 3 describes a manufacturing process of a memory transistor using a single crystal semiconductor substrate with reference to FIGS. 6A to 6E.

Figure 6A:
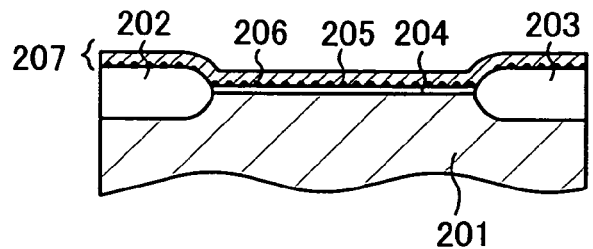
FIGS. 6A to 6E are each a cross-sectional view showing manufacturing steps of a semiconductor device according to the present invention.

As shown in FIG. 6A, element-isolated regions 202 and 203 are formed in a substrate 201. The substrate 201 is a single crystalline semiconductor substrate or a compound semiconductor substrate, typically, an n-type or a p-type single crystalline silicon substrate, a GaAs substrate, an InP substrate, a GaN substrate, an SiC substrate, or a ZnSe substrate. Alternatively, an SOI substrate (Silicon On Insulator) is used as the substrate 201. In this embodiment, a single crystalline silicon substrate is used as the substrate 201. The element-isolated regions 202 and 203 can be obtained by a known LOCOS (Local Oxidation of Silicon) method, a trench isolation method or the like. As the element-isolated regions 202 and 203, a silicon oxide film is formed by oxidizing a part of a silicon substrate by LOCOS. Thereafter, well ion injection, channel stop ion injection, and threshold voltage adjustment ion injection are appropriately carried out.

A surface of the substrate 201 is exposed by washing the surface of the substrate 201. Thereafter, a first insulating film 204 is formed by a known method. The first insulating film 204 is required to have a thin thickness since it serves as a tunnel oxide film of a memory transistor. Here, a silicon oxide film is formed by a thermal oxidization method as the first insulating film 204.

A first conductive film 207 containing silicon particles 205 is formed over the first insulating film 204 by a sputtering method. The first conductive film is formed under the conditions that an aluminum alloy containing Si of 2 wt % (Al—Si alloy) is used as a target and the substrate is heated at 150° C. as in Embodiment 2. Here, the same film-formation conditions as in Embodiment 1 are adopted. Thus, the first conductive film 207 containing silicon particles 205 and a first conductive layer 206 can be formed.

Figure 6B:
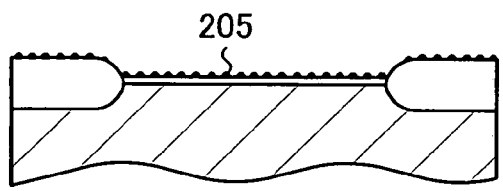

As shown in FIG. 6B, the first conductive layer 206 is removed. Here, an aluminum layer that is the first conductive layer is selectively etched with aluminum mixed acid to expose the silicon particles 205.

Figure 6C:
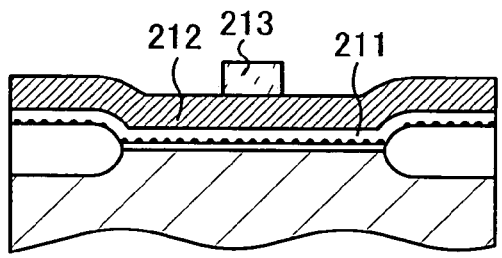

A second insulating film 211 is formed over the element-isolated regions 202 and 203, the first insulating film 204 and the silicon particles 205 as shown in FIG. 6C. Thereafter, a floating gate electrode may be formed according to the same process as in Embodiment Mode 3.

A second conductive film 212 is formed over the second insulating film 211. The second insulating film 211 and the second conductive film 212 can each be formed using the same materials and methods as the second insulating film 111 and the second conductive film 112 in Embodiment Mode 1. Then, a mask pattern 213 is formed over the second conductive film 212.

Figure 6D:
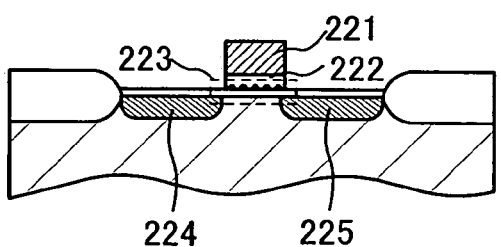

As shown in FIG. 6D, the second conductive film 212 is etched with the mask pattern 213 to form a gate electrode 221. The second insulating film 211 is etched to form a second insulating layer 222. In addition, the silicon particles 205 are etched to form a floating gate electrode 223 containing silicon particles. Here, the second conductive film 212 and the second insulating film 211 are etched by a dry etching method. In addition, the silicon particles 205 are etched by a wet etching method.

The substrate 201 is doped with an impurity element in a self-alignment manner with the mask pattern 213 and the gate electrode 221 as masks. Then, the mask pattern 213 is removed and then, the impurity element is activated by a heat treatment, a GRTA method, an LRTA method, or the like to form source and drain regions 224 and 225.

Figure 6E:
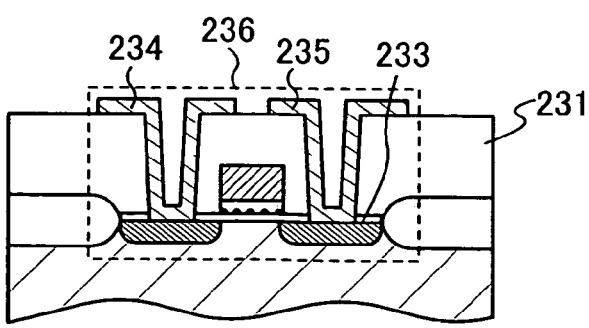

As shown in FIG. 6E, a third insulating film is formed. Then, parts of the third insulating film and the first insulating film 204 are etched to form a contact hole and to expose a part of the source and drain regions simultaneously. Herein, the third insulating film that has been etched is referred to as a third insulating layer 231 and the first insulating film that has been etched is referred to as a first insulating layer 233. After that, source and drain electrodes 234 and 235 to be connected to the source and drain regions are formed.

Through the above described steps, a memory transistor 236 including an activated region formed from a single crystal semiconductor substrate, the first insulating layer 233 serving as a tunnel oxide film, the floating gate electrode 223, the second insulating layer 222, and the gate electrode 221 can be formed.

This embodiment can be freely combined with Embodiment Modes 1 to 3 and Embodiments 1 and 2.

EMBODIMENT 4

Embodiment 4 describes a method for manufacturing a memory transistor having a lightly doped drain region (LDD) covered by a sidewall (sidewall spacer) and the region of the sidewall with reference to FIGS. 5A to 5E and 7A to 7E.

Figure 7A:
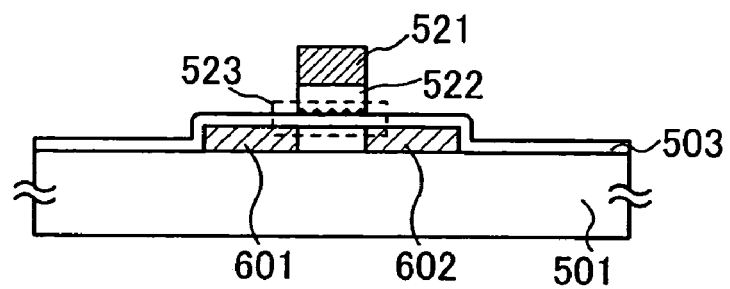
FIGS. 7A to 7E are each a cross-sectional view showing manufacturing steps of a semiconductor device according to the present invention.
Figure 7B:
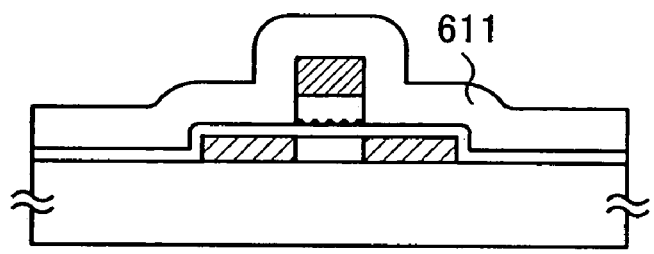

In this embodiment, since up to a process of forming a gate electrode is the same as in Embodiment 2, subsequent processes thereof are explained. According to the process explained in Embodiment 2, a gate electrode 521 is formed as shown in FIG. 5D. As shown in FIG. 7A, phosphorous (P) that is an impurity element imparting n-type conductivity is added to a semiconductor region 502 to form first lightly doped drain regions imparting n-type conductivity (hereinafter, a first n-type impurity region) 601 and 602.

A fourth insulating film 611 is formed over a gate electrode 521 and a second insulating film 503. A silicon oxide film is formed by a CVD method as the fourth insulating film.

Figure 7C:
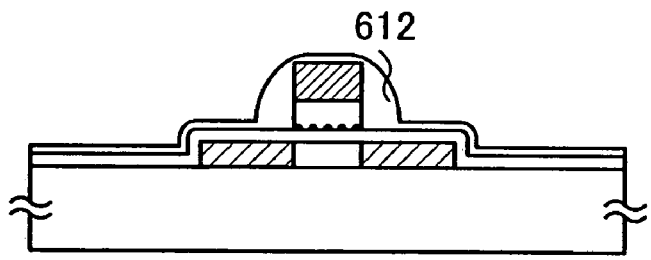

Then, the fourth insulating film 611 is anisotropically etched by a RIE (Reactive Ion Etching) method to from a sidewall (sidewall spacer) 612 as shown in FIG. 7C. At this time, a part of or a whole of the second insulating film is etched depending on a material for the insulating film. Here, a major part of the fourth insulating film is etched to form the sidewall 612.

Figure 7D:
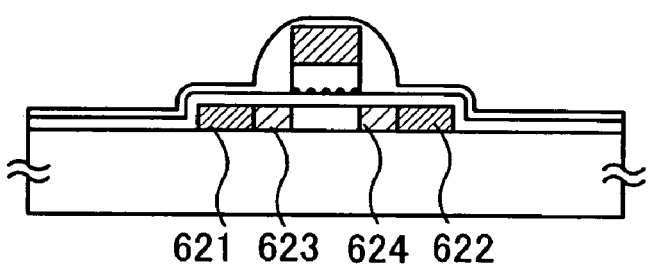
Figure 7E:
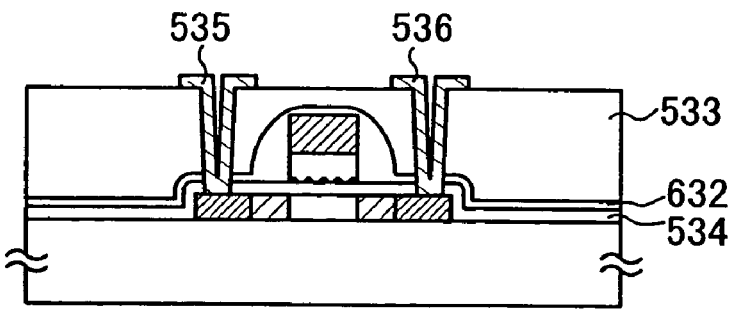

As shown in FIG. 7D, phosphorous (P) that is an impurity element imparting n-type conductivity is added to the semiconductor region 502 to form high concentration impurity regions (heavily doped regions) 621 and 622 (source and drain regions) imparting n-type conductivity. At the time, first lightly doped drain regions 623 and 624 (hereinafter, second n-type impurity region (LDD region)) imparting n-type conductivity covered by the sidewall 612 are formed. The second n-type impurity regions 623 and 624 are preferably formed to have widths of 0.01 to 0.3 μm. Thereafter, the impurity element is activated by a heat treatment.

After forming a fifth insulating film serving as an interlayer insulating film, as in Embodiment 2, a contact hole is formed by etching the fifth insulating film, and a part of the source and drain regions 621 and 622 is exposed. The fifth insulating film is formed by the same material and method as the fourth insulating film in Embodiment 2. The fifth insulating film that has been etched is referred to as a fifth insulating layer 533. Thereafter, as in Embodiment 2, source and drain electrodes 535 and 536 are formed.

Through the above described steps, a memory transistor including the semiconductor region 502 having the LDD regions 623 and 624, the second insulating layer 534 serving as a tunnel oxide film, the floating gate electrode 523, the third insulating layer 522, the gate electrode 521 and the sidewall 632 can be formed.

Since the memory transistor formed in this embodiment has a sidewall structure, an LDD region can be formed in a memory transistor having a submicron structure.

Although this embodiment describes the manufacturing process of the memory transistor having the LDD region covered by the sidewall, a memory transistor having an LDD region covered with a gate electrode (Gate Overlapped Drain (GOLD) region) by appropriately using a known oblique doping method or a doping method using a desired mask pattern can be also formed instead.

This embodiment can be freely combined with Embodiment Modes 1 to 3 and Embodiments 1 to 3.

EMBODIMENT 5

Embodiment 5 describes a manufacturing process of a memory transistor having a silicide structure with reference to FIGS. 8A to 8D.

Figure 8A:
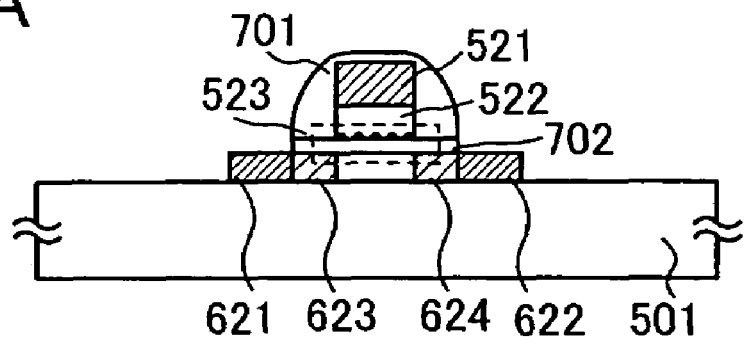
FIGS. 8A to 8D are each a cross-sectional view showing manufacturing steps of a semiconductor device according to the present invention.

In this embodiment, since up to a process of forming a gate electrode is the same as in Embodiment 2 and up to a process of forming source and drain regions is the same as in Embodiment 4, subsequent processes thereof are explained. According to Embodiment 4, a sidewall 701 and a second insulating layer 702 are formed and then source and drain regions 621 and 622 are formed as shown in FIG. 8A. In this embodiment, parts of a second insulating film 503 and a fourth insulating film 611 are etched with a semiconductor region as an etching stopper to expose a part of the semiconductor region and to form the sidewall 701. At this time, it is preferable to form a silicon nitride film (hard mask) over a gate electrode to serve as an etching stopper of the fourth insulating film 611. The hard mask can be formed by forming a silicon nitride film over the second conductive film in Embodiment 2 and etching it with the mask pattern 513.

Figure 8B:
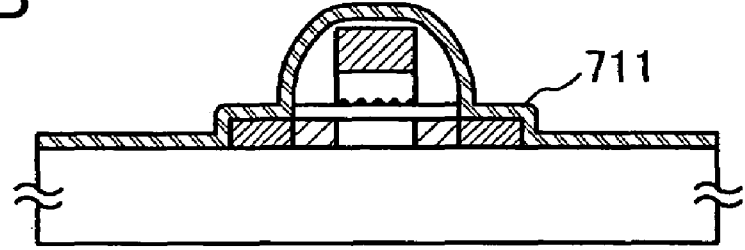

As shown in FIG. 8B, a conductive film 711 is formed. A film containing titanium (Ti), nickel (Ni), tungsten (W), molybdenum (Mo), cobalt (Co), zirconium (Zr), hafnium (Hf), tantalum (Ta), vanadium (V), neodymium (Nb), chrome (Cr), platinum (Pt), palladium (Pd) or the like is formed as the material of the conductive film 711. Here, a titanium film is formed by a sputtering method.

Figure 8C:
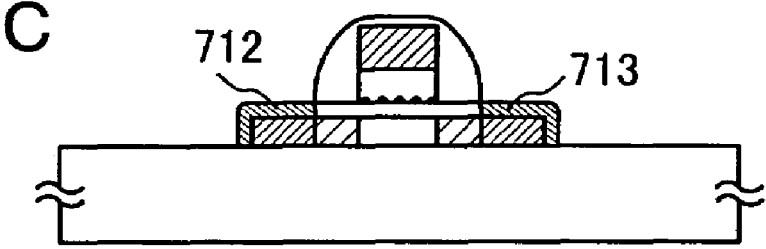
Figure 8D:
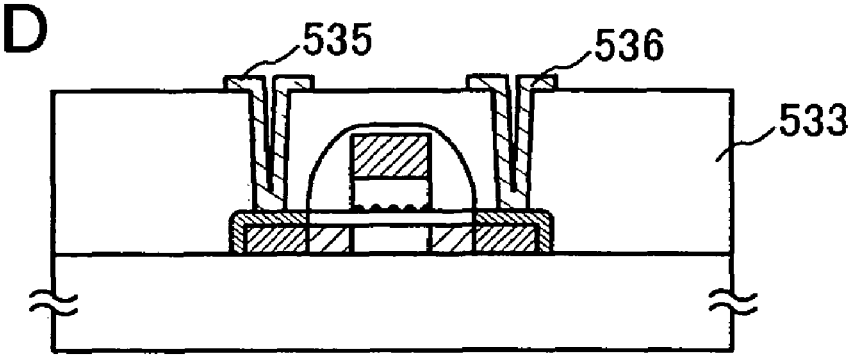

As shown in FIG. 8C, silicon in the exposed source and drain regions is reacted with a conductive film by a heat treatment, a GRTA method, an LRTA method, or the like to form silicides 712 and 713. Then, the conductive film 711 that has not reacted with silicon is removed.

After forming a fifth insulating film serving as an interlayer insulating film as in Embodiment 4, contact holes are formed by etching a part of the fifth insulating film, and parts of the silicides 712 and 713 are exposed. Then, source and drain electrodes 535 and 536 are formed as in Embodiment 2.

Through the above described steps, a memory transistor having a semiconductor region 502 having LDD regions 623 and 624, a second insulating layer 702 serving as a tunnel oxide film, a floating gate electrode 523, the third insulating layer 522, the gate electrode 521, and the silicides 712 and 713 can be formed.

Since the memory transistor according to this embodiment have a silicide structure, the resistance of source and drain regions can be reduced and semiconductor devices can be made operate at higher speed. Further, power consumption can be reduced since operation at low voltage is possible.

This embodiment can be freely combined with Embodiment Modes 1 to 3 and Embodiments 1 to 4.

EMBODIMENT 6

Embodiment 6 describes a process for manufacturing a semiconductor device having a memory transistor and a CMOS circuit, which are formed over one substrate is explained with reference to FIGS. 9A to 9F. In this embodiment, although the memory transistor and a TFT each have a single drain structure, the memory transistor and the TFT may have a sidewall, structure, a silicide structure or a GOLD structure by appropriately combining Embodiment 4 and 5. Further, a memory transistor and a MOS transistor may be formed using a semiconductor single crystal substrate by appropriately being combined with Embodiment 3.

Figure 9A:
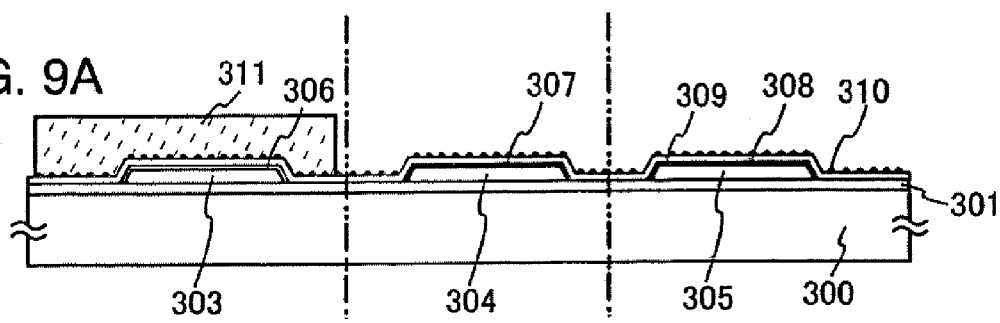
FIGS. 9A to 9F are each a cross-sectional view showing manufacturing steps of a semiconductor device according to the present invention.

As shown in FIG. 9A, a first insulating film 301 is formed on a glass substrate 300. The first insulating film 301 is formed in the same manner as the first insulating film 501 in Embodiment 2. A crystalline silicon film is formed according to the process in Embodiment 2 and the crystalline silicon film is etched into a desired shape by a photolithography process and an etching process to form first to third semiconductor regions 303 to 305. Note that the first, second and third semiconductor regions serve as an activated region of a memory transistor to be formed later, an activated region of an n-channel TFT to be formed later, and an activated region of a p-channel TFT to be formed later, respectively.

After removing a natural oxide film formed over the surfaces of the first to third semiconductor regions 303 to 305, the surfaces are exposed to ozone water containing hydroxy radical for several ten seconds to several minutes to form silicon oxide films on the surfaces of the first to third semiconductor regions 303 to 305. Thereafter, the silicon oxide films are made denser by a GRTA (Gas Rapid Thermal Anneal) method and an LRTA (Lamp Rapid Thermal Anneal) method to form second insulating films 306 to 308 having thicknesses of 1 to 2 nm. By this method, it is possible to process in a short time at high temperature, and thus the fine and dense second insulating films having thin thicknesses can be formed without elongating and contracting the substrate. Then, a third insulating film 309 is formed over the second insulating films 306 to 308 and the glass substrate 300. Here, a silicon nitride film or a silicon nitride oxide film (SiNO(N>O)) having a thickness of 1 to 5 nm is formed as the third insulating film 309.

Silicon particles 310 are formed according to the same process as in Embodiment 2. A mask pattern 311 is formed to cover the first semiconductor region 303 by a photolithography process.

Figure 9B:
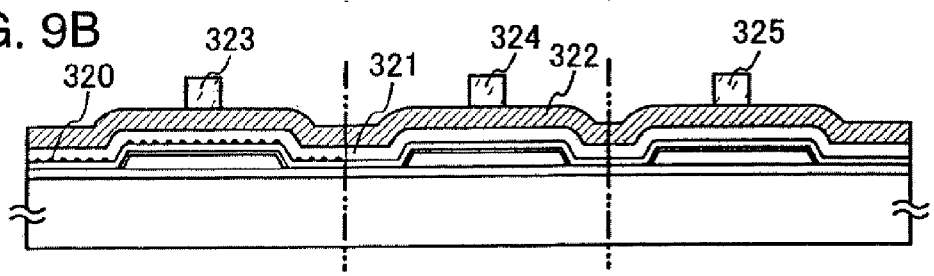

As shown in FIG. 9B, the silicon particles 310 are partially etched with the mask pattern 311. Here, the etching is conducted such that the silicon particles 320 remains only over the first semiconductor region 303. In this step, second insulating films 307 and 308 and the third insulating film 309 may be removed together with the silicon particles.

As shown in FIG. 9B, a fourth insulating film 321 and a second conductive film 322 are formed over the silicon particles 320 and the third insulating film 309. As the fourth insulating film 321, a silicon oxide film or a silicon oxynitirde film (SiON (O>N)) having a thickness of 20 to 50 nm is formed by a plasma CVD method. A tungsten film of 400 nm thick is formed as a second conductive film 322 by a sputtering method. Mask patterns 323 to 325 are formed over the first to third semiconductor regions 303 to 305 by a photolithography process.

Figure 9C:
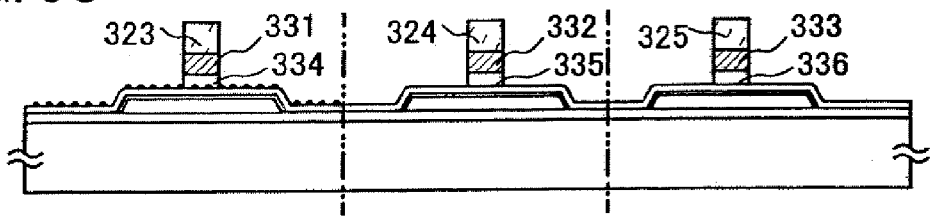

As shown in FIG. 9C, the second conductive film 322 is etched using the mask patterns 323 to 325 to form gate electrodes 331 to 333. The width of the gate electrode is 0.2 to 1.5 μm, preferably 0.2 to 0.7 μm. In addition, the fourth insulating film 321 is etched using the mask patterns 323 to 325 to form fourth insulating layers 334 to 336.

Figure 9D:
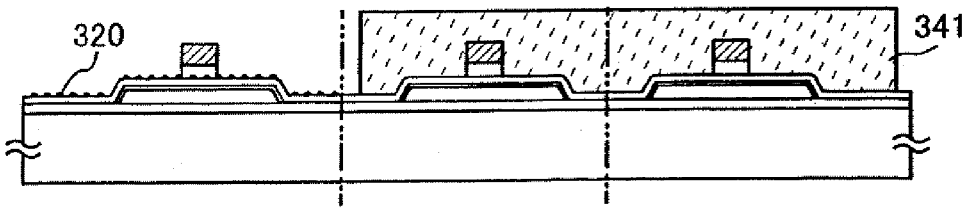
Figure 9E:
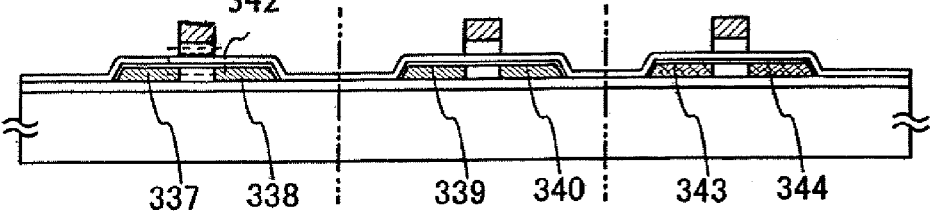

As shown in FIG. 9D, after removing the mask patterns 323 to 326, a mask pattern 341 is formed anew over the second semiconductor region 304 and the third semiconductor regions 305. The silicon particles 320 are etched with a gate electrode 331 and the fourth insulating layer 334 as masks to form a floating gate electrode 342 containing silicon particles as shown in FIG. 9E. After that, the mask pattern 341 is removed.

After a mask pattern covering the third semiconductor region 305 is formed by a photolithography process, the first and second semiconductor region 303 and 304 are doped with an impurity element using the gate electrodes 331 and 332 as masks. Here, phosphorous (P) that is an impurity element imparting n-type conductivity is added to each semiconductor region, thereby forming source and drain regions imparting n-type conductivities 337 to 340.

After the mask pattern covering the third semiconductor region 305 is removed, mask patterns covering the first and second semiconductor regions 303 and 304 are formed by a photolithography process. Then, an impurity element is added into the third semiconductor region 305 with the gate electrode 333 as a mask. Here, boron (B) that is an impurity element imparting p-type conductivity is added to the semiconductor region, thereby forming source and drain regions imparting p-type conductivities 343 and 344. After the mask pattern is removed, the impurity element in the source and drain regions is activated by a heat treatment. Then, an insulating film containing hydrogen may be formed and heated to hydrogenate the surface of the semiconductor region.

Figure 9F:
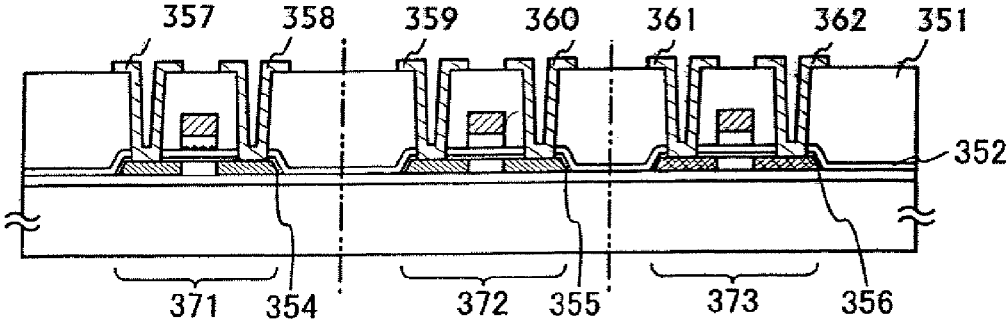

As shown in FIG. 9F, a fifth insulating film serving as an interlayer insulating film is formed. Here, siloxane based resin is applied and baked to form the fifth insulating film. The fifth insulating film, the third insulating film and the second insulating film are etched to form contact holes and to partially expose source region and drain regions 337 to 340, 343, and 344. Herein, the fifth insulating film that has been etched is referred to as a fifth insulating layer 351, the third insulating film that has been etched is referred to as a third insulating layer 352 and the second insulating films that have been etched are referred to as second insulating layers 354 to 356. A titanium film, an aluminum-silicon alloy film and a titanium film are stacked by a sputtering method, and then source and drain electrodes 357 to 362 are formed by a photolithography process and an etching process.

Through the above described steps, a memory transistor 371 including the first semiconductor region 303, the second and third insulating layers 354 and 352 serving as tunnel oxide films, the floating gate electrode 342, the fourth insulating layer 334, and the gate electrode 331 can be formed. An n-channel TFT 372 including the second semiconductor region 304, the second insulating layer 355 serving as a gate insulating film, a third insulating layer 352 and a fourth insulating layer 335 and a gate electrode 332 can be formed. In addition, a p-channel TFT 373 including the third semiconductor region 305, the second insulating layer 356 serving as a gate insulating film, a third insulating layer 352 and a fourth insulating layer 336 and a gate electrode 333 can be formed. Further, a CMOS circuit can be formed using the n-channel TFT 372 and the p-channel TFT 373. Moreover, a semiconductor device in which the memory transistor 371 having a single drain structure, the n-channel TFT 372 and the p-channel TFT 373 are formed over one substrate can be formed.

This embodiment can be freely combined with Embodiment Modes 1 to 3 and Embodiments 1 to 5.

EMBODIMENT 7

Figure 14:
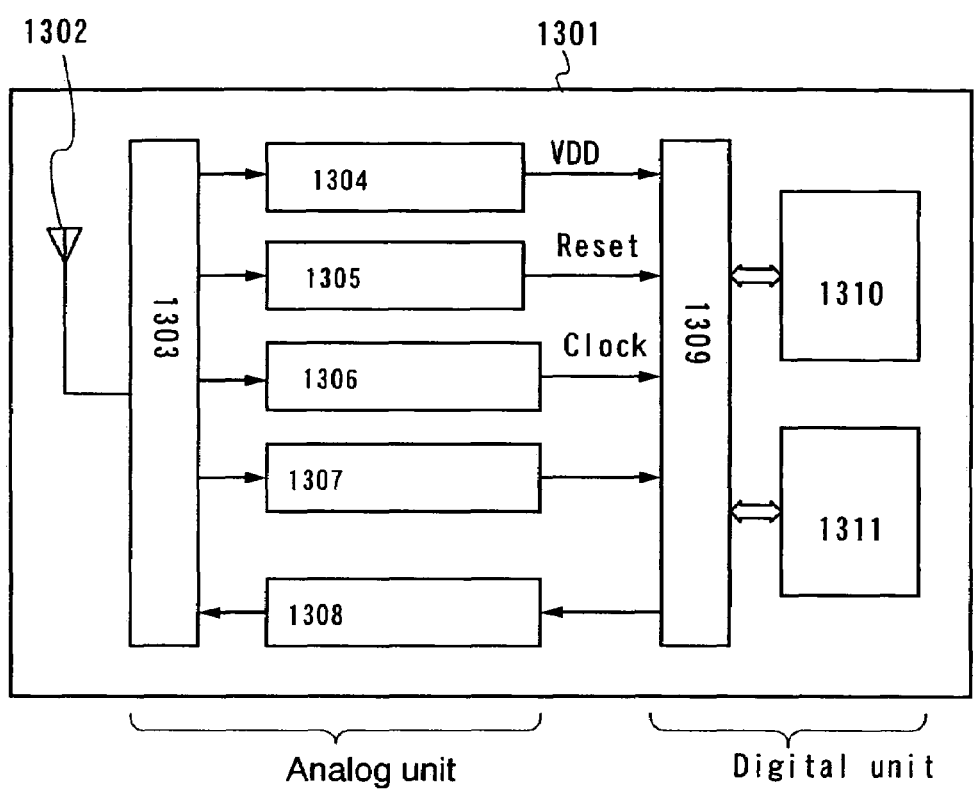
FIG. 14 is a block diagram showing a structure of a semiconductor device according to the present invention.

FIG. 14 is a typical block diagram of an ID chip to which can be applied by a semiconductor device according to the present invention and that is as typified by such as a non-contact RFID (Radio Frequency Identification) tag or a wireless tag. FIG. 14 shows a structure having a simple function of reading out fixed data such as identification data. In FIG. 14, an ID chip 1301 includes an antenna 1302, a high frequency circuit 1303, a power source circuit 1304, a reset circuit 1305, a clock generation circuit 1306, a data demodulation circuit 1307, a data modulation circuit 1308, a control circuit 1309, a nonvolatile memory (hereinafter, also referred to as NVM) 1310, and a ROM 1311.

In this embodiment, a memory transistor shown in Embodiment Modes and Embodiments of the present invention is used as the NVM 1310. A transistor that makes up the high frequency circuit 1303, the reset circuit 1305, the clock generation circuit 1306, the data demodulation circuit 1307, the data modulation circuit 1308, the control circuit 1309, the ROM 1311, and power source circuit 1304 can be manufactured simultaneously with a memory transistor as shown in Embodiment 6. As noted above, an RFID tag can be manufactured efficiently over one substrate.

All circuits illustrated in FIG. 14 are formed over a glass substrate, a flexible substrate, or a semiconductor substrate. The antenna 1302 may be formed over the glass substrate, the flexible substrate, or the semiconductor substrate, alternatively, provided outside the substrate to be connected to a semiconductor integrated circuit in the substrate.

The high frequency circuit 1303 receives an analog signal from the antenna 1302 and outputs an analog signal received from the data modulation circuit 1308 from the antenna 1302. The power source circuit 1304 is a circuit generating a constant power source from a received signal, the reset circuit 1305 is a circuit generating a reset signal, the clock generation circuit 1306 is a circuit generating a clock signal, the data demodulation circuit 1307 is a circuit extracting data from a received signal, and the data modulation circuit 1308 is a circuit generating an analog signal to be outputted to an antenna based on a digital signal received from the control circuit or varying an antenna characteristic. These circuits are included in an analog unit.

On the other hand, the control circuit 1309 receives data extracted from the received signal to read out the data. Specifically, the control circuit 1309 generates an address signal of the NVM 1310 or the ROM 1311, reads out data, and sends the read data to the data demodulation circuit. These circuits are included in a digital unit.

This embodiment can be freely combined with Embodiment Modes 1 to 3 and Embodiments 1 to 6.

EMBODIMENT 8

Figure 15A:
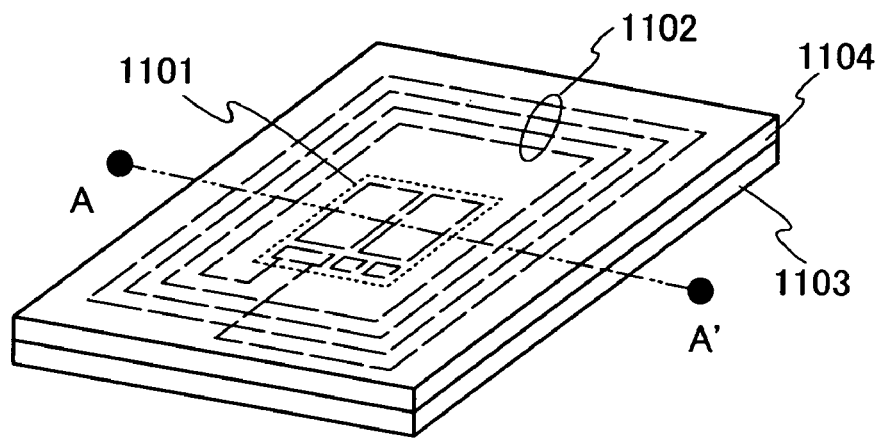
FIGS. 15A and 15B are each a perspective view showing a semiconductor device according to the present invention.

FIG. 15A is a perspective view of one mode of an ID chip to which can be applied by a semiconductor device according to the present invention. Reference numeral 1101 denotes an integrated circuit and 1102 denotes an antenna. The antenna 1102 is connected to the integrated circuit 1101. Reference numeral 1103 denotes a substrate, and 1104 denotes a cover material. The integrated circuit 1101 and the antenna 1102 are formed over the substrate 1103. The cover material 1104 is overlapped with the substrate 1103 so as to cover the integrated circuit 1101 and the antenna 1102. Although the cover material 1104 is not always required, the cover material can enhance a mechanical strength of an ID chip by covering the integrated circuit 1101 and the antenna 1102 with the cover material. In addition, the antenna may cover the integrated circuit, in other words, an area occupied by the integrated circuit may be equal to an area occupied by the antenna.

Figure 15B:
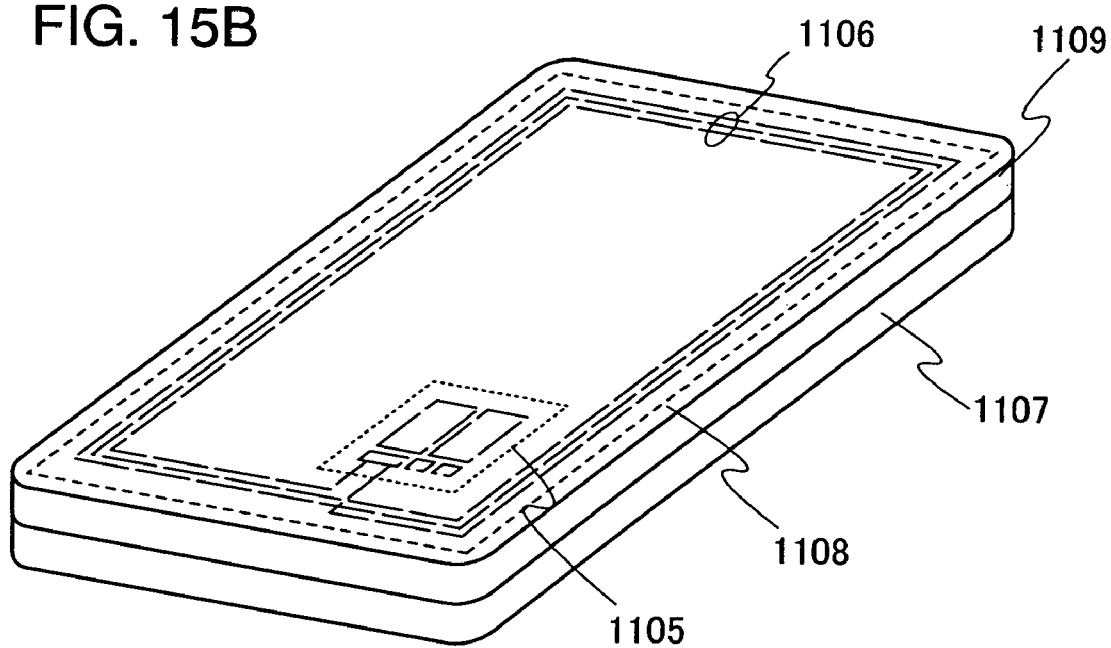

FIG. 15B is a perspective view of one mode of an IC card to which can be applied by a semiconductor device according to the present invention. Reference numeral 1105 denotes an integrated circuit and 1106 denotes an antenna. The antenna 1106 is connected to the integrated circuit 1105. Reference numeral 1108 denotes a substrate serving as an inlet sheet, and reference numerals 1107 and 1109 denote cover materials. The integrated circuit 1105 and the antenna 1106 are formed over the substrate 1108, and the substrate 1108 is interposed between the cover materials 1107 and 1109. The IC card according to the present invention may have a display device connected to the integrated circuit 1105.

Figure 16A:
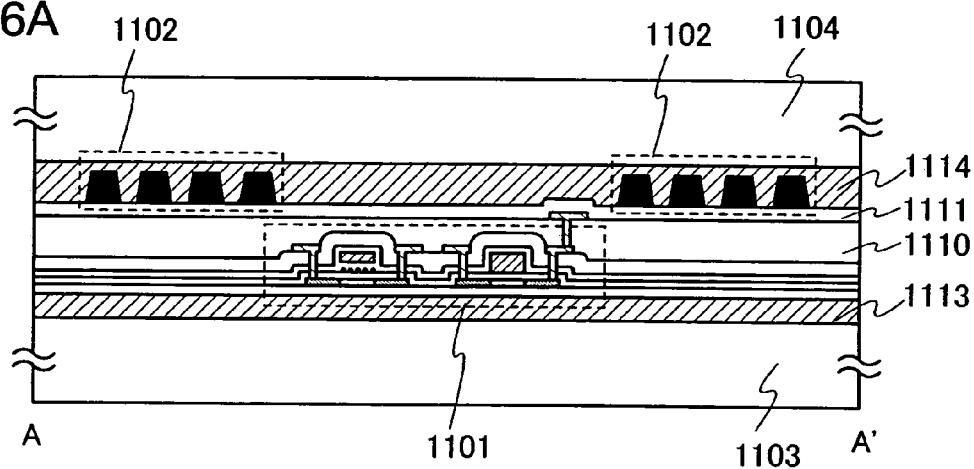
FIGS. 16A to 16C are each a cross-sectional view of a semiconductor device according to the present invention.
Figure 16B:
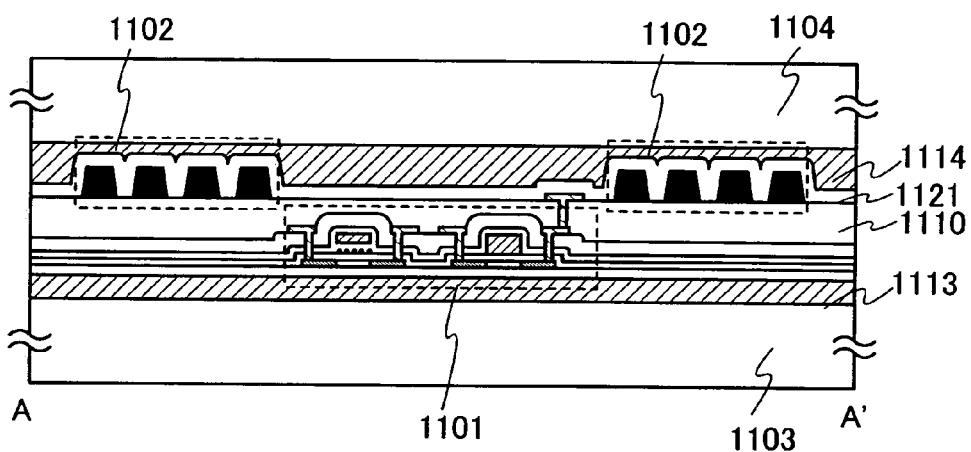

FIGS. 16A and 16B show cross-sectional views taken along a line A-A' of the ID chip illustrated in FIG. 15A. In the ID chip, the substrate 1103 and the cover material 1104 are attached to the integrated circuit 1101 formed by a separation process and the antenna 1102 connected thereto by adhesive agents 1113 and 1114.

The integrated circuit 1101 can be formed by a memory transistor described in any one of Embodiment Modes 1 to 3 or Embodiments 1 to 8. The semiconductor element used in the integrated circuit 1101 is not limited to this. For example, a memory element, a diode, a photoelectric conversion element, a resistor element, a coil, a capacitor element, an inductor, and the like can be used in addition to a TFT.

As shown in FIG. 16A, an interlayer insulating film 1110 is formed over a memory transistor and a TFT of the integrated circuit 1101, a barrier film 1111 made of a silicon nitride film or the like is formed over the interlayer insulating film 1110, and the antenna 1102 is formed thereover.

On the other hand, as shown in FIG. 16B, the interlayer insulating film 1110 may be formed over the memory transistor and the TFT of the integrated circuit 1101, the antenna 1102 may be formed over the interlayer insulating film 1110, and a barrier film 1121 may be formed over the interlayer insulating film 1110 and the antenna 1102. By providing the barrier film, an ID chip with improved reliability can be provided without contaminating the integrated circuit 1101.

The substrate 1103 and the cover material 1104 can be made from a material having flexibility such as plastic, organic resin, paper, fiber, or carbon graphite. In the case of using biodegradable resin for the cover materials, the cover materials are degraded by bacteria to be reduced to soil. Since the integrated circuit in this embodiment is made from silicon, aluminum, oxygen, nitrogen, or the like, a pollution-free ID chip can be manufactured. By using a flammable pollution-free material such as paper, fiber or carbon graphite as the cover material, the used ID chip can be burned out or cut out. The ID chip using these materials is pollution-free since it does not generate a poisonous gas even when the ID chip is burned.

The integrated circuit 1101 interposed between the substrate 1103 and the cover material 1104 is preferably formed to have a thickness of 5 μm or less, more preferably, 0.1 to 3 μm. When the thickness in which the substrate 1103 and the cover material 1104 are overlapped is set as d, the total thickness of the substrate 1103 and the cover material 1104 is preferably (d/2)±30 μm, more preferably (d/2)±10 μm. Further, the total thickness of the substrate 1103 and the cover material 1104 is preferably 10 to 200 μm. Moreover, the area of the integrated circuit 1101 is 5 mm square (25 mm$^2$) or less, preferably, 0.3 to 4 mm square (0.09 to 16 mm$^2$).

Since the substrate 1103 and the cover material 1104 are made from organic resin materials, the substrate 1103 and the cover material 1104 have high resistance to bending. The integrated circuit 1101 formed by a separation process in itself also has high resistance to bending as compared to a single crystal semiconductor. Since the integrated circuit 1101, the substrate 1103 and the cover material 1104 can be stuck together, the complete ID chip itself thus has high resistance to bending. The integrated circuit 1101 surrounded by the substrate 1103 and the cover material 1104 may be placed on the surface or in the inside of another solid material or embedded in a piece of paper.

Figure 16C:
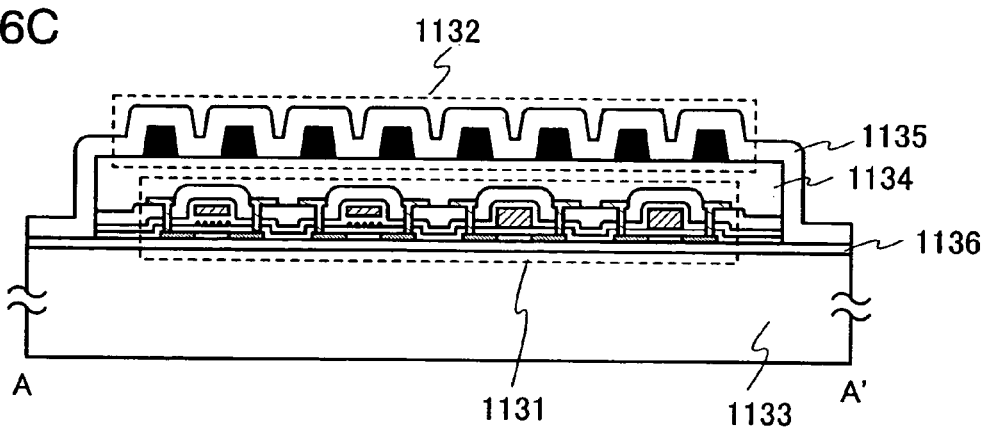

Further, as shown in FIG. 16C, an integrated circuit 1131 is formed over a glass substrate 1133 with a base insulating film 1136 therebetween, an interlayer insulating film 1134 is formed over memory transistors and TFTs in the integrated circuits, and an antenna 1132 is formed over the interlayer insulating film 1134. Then, the insulating film and the interlayer insulating film in the periphery of the integrated circuit 1131 are removed to expose the base insulating film 1136. Thereafter, a passivation film 1135 is formed to be in contact with the base insulating film 1136, and to cover the integrated circuit 1131, the interlayer insulating film 1134 and the antenna 1132. Silicon nitride, silicon oxide, silicon nitride oxide, silicon oxynitride, aluminum oxynitride, aluminum oxide, diamond like carbon (DLC), carbon containing nitride, or other insulating material, which are each insulating films having high blocking effects, are used for the base insulating film 1136 and the passivation film 1135. Thus, the integrated circuit 1131 is not contaminated without providing a cover material, and thus, an ID chip having improved reliability can be provided.

The antenna 1102 is preferably gold, silver, copper, aluminum, or metal plated by gold, silver, copper, or aluminum. The integrated circuit 1101 and the antenna 1102 are formed using anisotropic conductive films.

In FIGS. 16A and 16B, an example of attaching a stacked body having the integrated circuit and the antenna formed over the interlayer insulating film of the integrated circuit by using the cover material and the substrate is described; however, the present invention is not limited thereto. A cover material provided with the antenna and the integrated circuit can be fixed with an adhesive agent. In this case, the antenna and the integrated circuit are connected by an anisotropic conductive adhesive agent or an anisotropic conductive film by performing a UV treatment or an ultrasonic treatment; however, the present invention is not limited thereto. In the present invention, various methods can be adopted.

This embodiment can be freely combined with Embodiment Modes 1 to 3 and Embodiments 1 to 7.

EMBODIMENT 9

A case of applying a system LSI to which can be applied by a semiconductor device according to the present invention is explained with reference to FIG. 17.

The system LSI is an LSI constituting a system that is installed in the interior of a device expected to be used for a specific application to control the device and to process data. The application thereof is wide-ranging, for example, the system LSI can be used in a cellular phone, a PDA, a DSC (digital still camera), a television, a printer, a facsimile, a game machine, a car navigation, a DVD player and the like.

Figure 17:
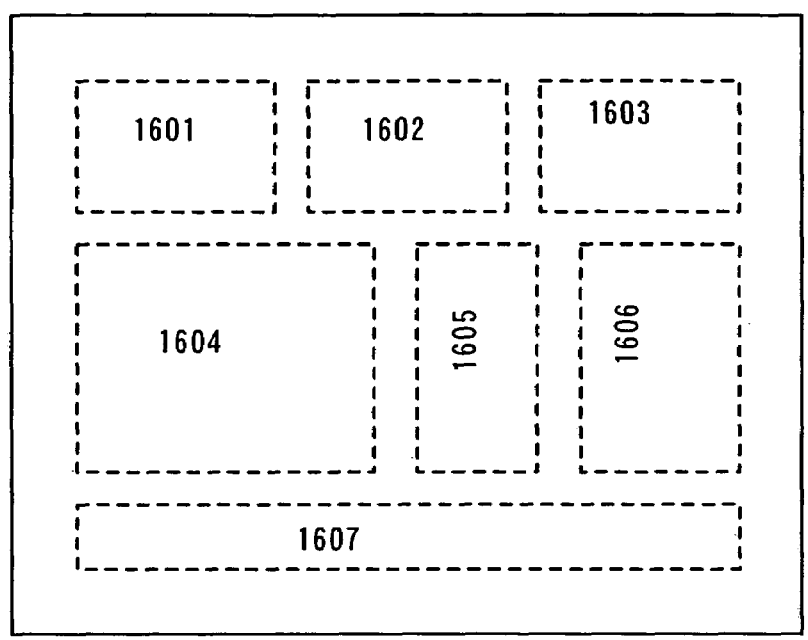
FIG. 17 is a block diagram showing a structure of a semiconductor device according to the present invention.

FIG. 17 shows one example of the system LSI. Typically, the system LSI mainly includes a micro processor 1601, a nonvolatile memory (NVM) 1604, a clock controller 1603, a main memory 1602, a memory controller 1605, an interrupt controller 1606, an I/O port 1607, and the like. Needless to say, the system LSI shown in FIG. 17 is a simplified example. Various circuit designs are performed in an actual system LSI depending on its application.

The memory transistor according to the present invention can be used in the NVM 1604.

A transistor that constitutes the micro processor 1601, the clock controller 1603, the main memory 1602, the memory controller 1605, the interrupt controller 1606, and the I/O port 1607 can be formed by the same process as a memory transistor of the present invention. Accordingly, various circuits can be manufactured over one substrate.

This embodiment can be freely combined with Embodiment Modes 1 to 3 and Embodiments 1 to 9.

EMBODIMENT 10

Figure 18A:
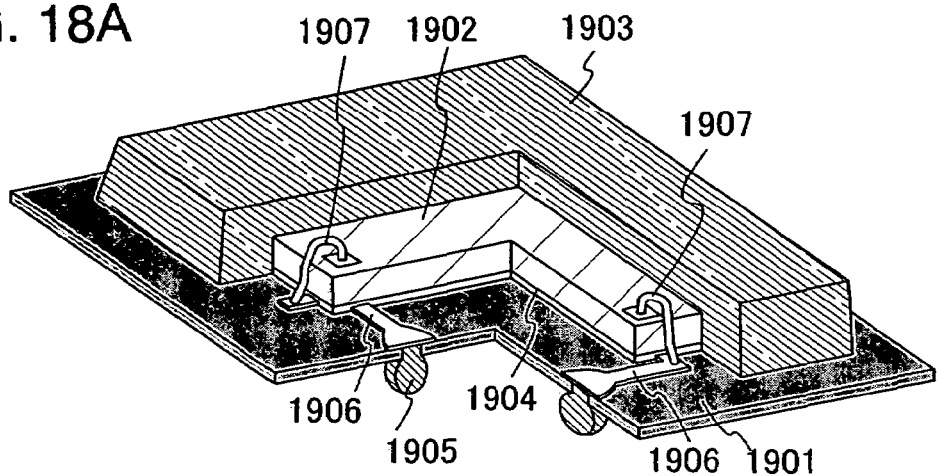
FIGS. 18A and 18B are each a perspective view showing a semiconductor device according to the present invention.
Figure 18B:
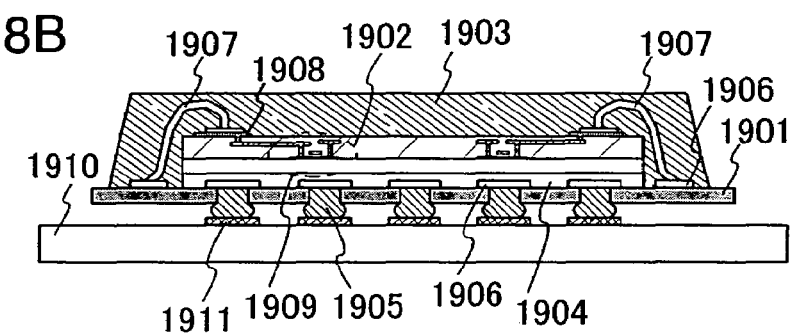

In this embodiment, a package that is one example of a semiconductor device formed according to the present invention is explained with reference to FIGS. 18A and 18B. FIG. 18A is a perspective view for showing a cross-sectional structure of the package in which a chip is connected to an interposer by a wire bonding method. Reference numeral 1901 denotes an interposer; 1902 denotes a chip; and 1903 denotes a mold resin layer. The chip 1902 is mounted on the interposer 1901 by an adhesive agent for mounting 1904.

The interposer 1901 shown in FIG. 18A is a ball grid array type interposer provided with a solder ball 1905. The solder ball 1905 is provided for the side opposite to a side provided with the chip 1902 of the interposer 1901. A wiring 1906 provided for the interposer 1901 is electrically connected to the solder ball 1905 through a contact hole provided for the interposer 1901.

In this embodiment, the wiring 1906 for electrically connecting the chip 1902 to the solder ball 1905 is provided over the surface provided with the chip of the interposer 1901; however the interposer used in the present invention is not limited thereto. For instance, the wiring may be formed to have a stacked layer structure in the inside of the interposer.

In FIG. 18A, the chip 1902 is electrically connected to the wiring 1906 by a wire 1907. FIG. 18B shows a cross-sectional structure of the package shown in FIG. 18A. The chip 1902 is provided with a semiconductor element 1909 described in Embodiment Modes 1 to 3 and Embodiments 1 to 6. Further, a pad 1908 is provided for the side opposite to the side provided with the interposer 1901 of the chip 1902. The pad 1908 is electrically connected to the semiconductor element 1909. The pad 1908 is connected to the wiring 1906 provided for the interposer 1901 by the wire 1907.

Reference numeral 1910 denotes a part of a printed wiring board and reference numeral 1911 denotes a wiring or electrode provided for the printed wiring board 1910. The wiring 1906 is connected to the wiring or electrode 1911 provided for the printed wiring board 1910 by the solder ball 1905. For the connection of the solder ball 1905 and the wiring or electrode 1911, various methods such as thermocompression or thermocompression with supersonic vibration can be adopted. Gaps between solder balls after being compressed may be filled with underfill to improve the mechanical strength of the connecting portion and the efficiency on thermal diffusion of heat generated in the package. Though the underfill is not always required, the underfill can prevent connection deterioration by the stress caused by mismatch in thermal expansion coefficients of the interposer and the chip. In the case of compressing with ultrasonic waves, connection deterioration can be suppressed as compared to the case of simply thermocompression.

This embodiment explains the package in which the chip is connected to the interposer by a wire bonding method; however, the present invention is not limited thereto. The chip may be connected to the interposer by a flip chip method. In this case, pitches between pads can be comparatively kept large as compared to the wire bonding method even if the number of pads to be connected is increased, the flip chip method is suitable for connecting chips having a large number of terminals.

The chips can be stacked within the package. In this case, since a plurality of chips can be provided in one package, there is an advantage that the whole size of the package can be made small.

Moreover, a plurality of packages may be stacked. The structure has an advantage of improving a yield because electrical testing of each package can be carried out to select only conforming articles to be stacked.

Further, the package formed according to this embodiment can be provided for a display device, an electrical device, and the like.

This embodiment can be freely combined with Embodiment Modes 1 to 3 and Embodiments 1 to 9.

EMBODIMENT 11

An ID chip 20 to which is applied by a semiconductor device according to the present invention can be used by providing it for paper money, coins, securities, certificates, bearer bonds, packing containers, documents, recording media, personal items, vehicles, foods, garments, health articles, commodities, medicines, electric devices, and the like.

Figure 19A:
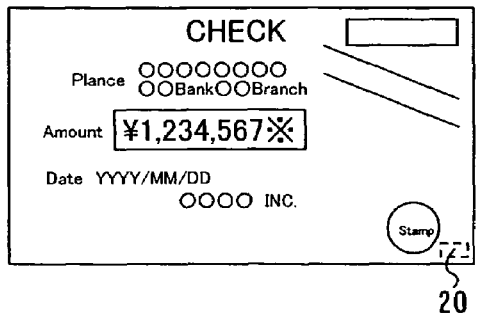
FIGS. 19A to 19H each show an application example of a semiconductor device according to the present invention.
Figure 19B:
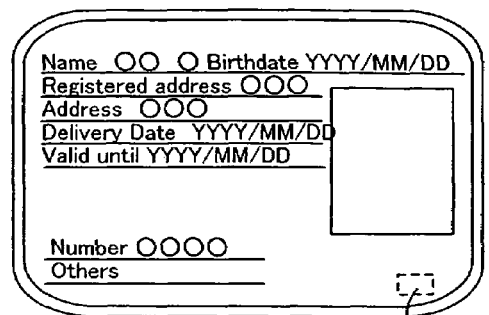
Figure 19C:
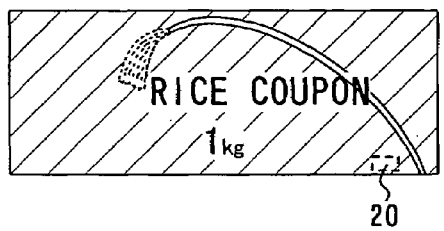
Figure 19D:
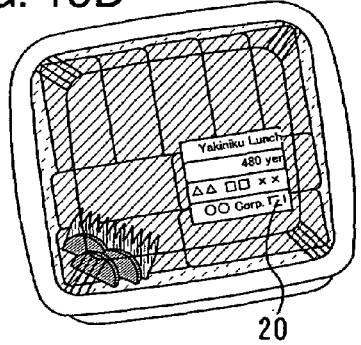
Figure 19E:
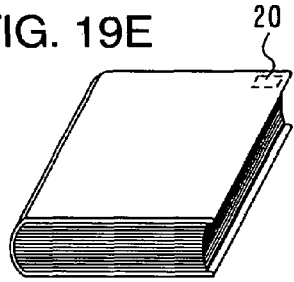
Figure 19F:
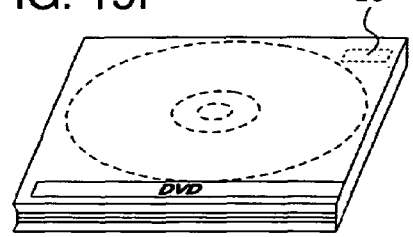
Figure 19G:
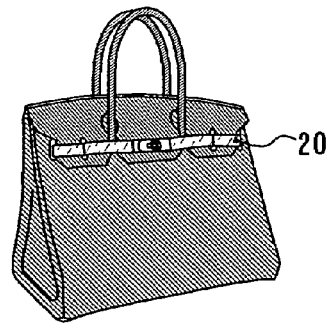
Figure 19H:
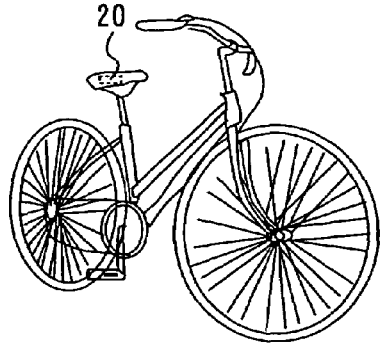

The paper money or the coins are money distributed in the market and include currency such as cash vouchers available in a certain area or memorial coins. The securities refer to checks, certificates, promissory notes, and the like (FIG. 19A). The certificates refer to a driver's license, a certificate of residence, and the like (FIG. 19B). The bearer bonds refer to stamps, rice coupons, various merchandise coupons, and the like (FIG. 19C). The packing containers refer to wrapping paper for lunch, plastic bottles, and the like (FIG. 19D). The documents refer to books and the like (FIG. 19E). The recording media refer to DVD software, a video tape, and the like (FIG. 19F). The personal items refer to a bag, or glasses, and the like (FIG. 19G). The vehicles refer to wheeled vehicles such as bicycles, ship and vessel, and the like (FIG. 19H). The foods refer to food articles, drinks, and the like. The garments refer to clothes, chaussures, and the like. The health articles refer to medical appliances, health appliances, and the like. The commodities refer to furniture, lighting equipment, and the like. The medicines refer to medical products, pesticides, and the like. The electronic devices refer to a liquid crystal display device, an EL display device, a television device (TV sets or a flat-screen television), cellular phone, and the like.

Counterfeits can be prevented by providing an ID chip to each of the paper money, coins, securities, certificates, bearer bonds, and the like. The efficiency of an inspection system or a system used in a rental shop can become more efficient by providing an ID chip to each of the packing containers, the documents, the recording media, the personal items, the commodities, the vehicles, the foods, the garments, the health articles, the medicines, the electric appliances. By providing an ID chip to each of the vehicles, health articles, medicines, and the like, counterfeits or theft can be prevented, further, medicines can be prevented from being taken mistakenly. The ID chip is provided to such articles by pasting on their surfaces or embedding thereinto. For example, the ID chip may be embedded in a sheet of a book or embedded in organic resin of a package made from the organic resin.

Figure 20A:
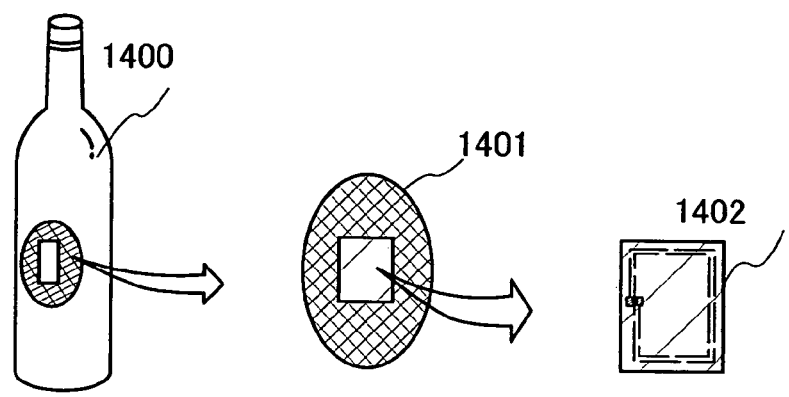
FIGS. 20A and 20B each show an application example of a semiconductor device according to the present invention.
Figure 20B:
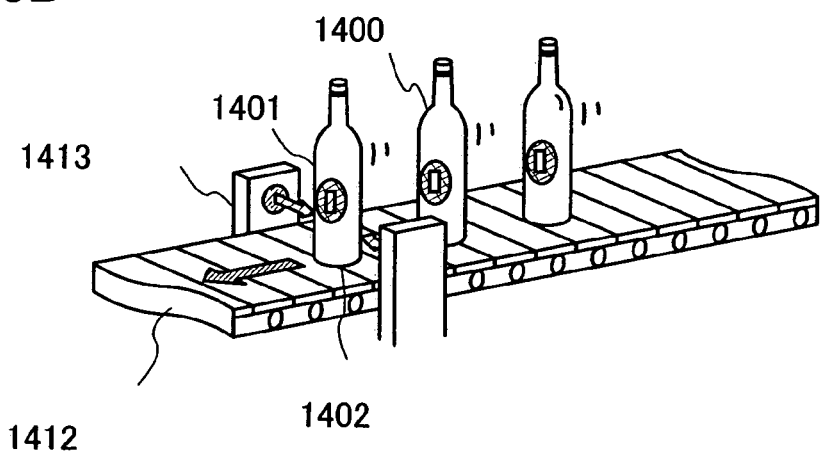

An example that can be applied to physical distribution management or a distribution system is explained with reference to FIGS. 20A and 20B. Here, an example of mounting an ID chip onto a product is explained. As shown in FIG. 20A, an ID chip 1402 is mounted onto a label 1401 to be pasted on a beer bottle 1400.

The ID chip 1402 records basic information such as a manufacturing date, a manufacturing area, a used material, and the like. Such basic information may be recorded by a memory that cannot rewrite data such as a mask ROM, because the basic information is not required to be rewritten. In addition, the ID chip 1402 records individual information such as a delivery destination, a delivery date, and the like of each beer bottle. For instance, as illustrated in FIG. 20B, each of the delivery destination and the delivery date can be recorded when each of the beer bottle 1400 is moved along a belt conveyor 1412 to pass through a writer device 1413. Such individual information may be recorded by a rewritable and erasable memory. A nonvolatile memory including a memory transistor described in Embodiment Modes and Embodiments of the present invention can be used as the memory.

When information on purchased products is sent to a logistics control center on a network from a delivery destination, a system in which a delivery address or a delivery date is calculated by a writer, a personal computer that controls the writer, or the like and the calculated information is recorded in the ID chip is preferably constructed depending on the product information.

Since delivery is made in units of cases, the ID chip can be mounted to units of cases or units of a plurality of cases to record individual information.

A product capable of being recorded with a plurality of delivery destinations can reduce the time of typing by hand, and further, reduce typing errors due to inputting by hand by means of mounting the ID chip. In addition, a personnel cost that is the largest cost in a logistics field can be decreased. By mounting the ID chip, logistics control can be carried out with few errors at low cost.

Application information such as foods to go with beer, a recipe using beer, and the like may be recorded at the delivery destination. As a result, foods and the like can also be advertised to drive buying inclination of a consumer. Such applications may be stored in a memory that can rewrite and erase data. A nonvolatile memory constituted by a memory transistor shown in Embodiment Modes and Embodiments of the present invention can be used as the memory. Information provided to consumers can be increased by mounting an ID chip in this manner; therefore consumers can purchase products with a sense of security. The present application is based on Japanese Priority Application No. 2004-176189 filed on Jun. 14, 2004 with the Japanese Patent Office, the entire contents of which are hereby incorporated by reference.

What is claimed is:

1. A method for manufacturing a semiconductor device, comprising the steps of:
   forming a first insulating film over a semiconductor region;
   sputtering, as a target, a solid solution containing a metal element and silicon that exceeds a solid solubility limit with respect to the metal element so as to form a conductive film including particles formed of the silicon and a metal element layer over the first insulating film;
   removing the metal element layer so that the particles formed of the silicon can remain;
   forming a second insulating film over the particles formed of the silicon after removing the metal element layer;
   forming a gate electrode over the second insulating film;
   etching the second insulating film partially to expose a portion of the particles formed of the silicon; and
   removing the exposed portion of the particles formed of the silicon to form a floating gate electrode.

2. The method for manufacturing a semiconductor device according to claim 1, wherein the metal element is one or a plurality of beryllium, aluminum zinc, gallium, germanium, silver, cadmium, indium, tin, antimony, gold, lead and bismuth.

3. The method for manufacturing a semiconductor device according to claim 1, wherein the solid solubility limit is a solid solubility limit concentration at a film-formation temperature of the conductive film.

4. A method for manufacturing a semiconductor device, comprising the steps of:
   forming a first insulating film over a semiconductor region;
   forming a conductive film including particles formed of silicon and a metal element layer over the first insulating film;
   oxidizing the metal element layer to form a metal oxide film;
   forming a second insulating film over the metal oxide film;
   forming a gate electrode over the second insulating film;
   etching the second insulating film and the metal oxide film partially to expose a portion of the particles formed of the silicon; and
   removing the exposed portion of the particles formed of the silicon to form a floating gate electrode.

5. The method for manufacturing a semiconductor device according to claim 4, wherein the metal element is one or a plurality of beryllium, aluminum, zinc, gallium, germanium, silver, cadmium, indium, tin, antimony, gold, lead and bismuth.

6. The method for manufacturing a semiconductor device according to claim 4, wherein the conductive film including the particles formed of the silicon and the metal element layer is formed by sputtering, as a target, a solid solution containing a metal element and the silicon that exceeds a solid solubility limit with respect to the metal element.

7. The method for manufacturing a semiconductor device according to claim 6, wherein the solid solubility limit is a solid solubility limit concentration at a film-formation temperature of the conductive film.

8. A method for manufacturing a semiconductor device comprising the steps of:
   forming a first insulating film over a semiconductor region;
   sputtering, as a target, a solid solution containing a metal element and silicon that exceeds a solid solubility limit with respect to the metal element so as to form a conductive film including particles formed of the silicon and a metal element layer over the first insulating film;
   removing the metal element layer so that the particles formed of the silicon can remain;
   forming a mask pattern over the particles formed of the silicon after removing the metal element layer;
   etching the particles formed of the silicon partially to form a floating gate electrode;
   forming a second insulating film over the floating gate electrode; and
   forming a gate electrode over the second insulating film.

9. The method for manufacturing a semiconductor device according to claim 8, wherein the metal element is one or a plurality of beryllium, aluminum, zinc, gallium, germanium, silver, cadmium, indium, tin, antimony, gold, lead and bismuth.

10. The method for manufacturing a semiconductor device according to claim 8, wherein the solid solubility limit is a solid solubility limit concentration at a film-formation temperature of the conductive film.

11. A method for manufacturing a semiconductor device, comprising the steps of:
   forming a first insulating film over a semiconductor region;
   forming a conductive film including particles formed of silicon and a metal element layer over the first insulating film;
   oxidizing the metal element layer to form a metal oxide film;
   forming a mask pattern over the metal oxide film;
   etching the metal oxide film and the particles formed of the silicon partially to form a floating gate electrode;
   forming a second insulating film over the floating gate; and
   forming a gate electrode over the second insulating film.

12. The method for manufacturing a semiconductor device according to claim 11, wherein the metal element is one or a plurality of beryllium, aluminum, zinc, gallium, germanium, silver, cadmium, indium, tin, antimony, gold, lead and bismuth.

13. The method for manufacturing a semiconductor device according to claim 11, wherein the conductive film including particles formed of the silicon and the metal element layer is formed by sputtering, as a target, a solid solution containing the metal element and the silicon that exceeds a solid solubility limit with respect to the metal element.

14. The method for manufacturing a semiconductor device according to claim 13, wherein the solid solubility limit is a solid solubility limit concentration at a film-formation temperature of the conductive film.

15. A method for manufacturing a semiconductor device, comprising the steps of:
   forming a semiconductor region over a substrate;

forming a first insulating film over the semiconductor region;

sputtering, as a target, a solid solution containing a metal element and silicon that exceeds a solid solubility limit with respect to the metal element while heating the substrate, so as to form a conductive film including particles formed of the silicon and a metal element layer over the first insulating film;

removing the metal element layer so that the particles formed of the silicon can remain;

forming a second insulating film over the particles formed of the silicon after removing the metal element layer;

forming a gate electrode over the second insulating film;

etching the second insulating film partially to expose a portion of the particles formed of the silicon; and removing the exposed portion of the particles formed of the silicon to form a floating gate electrode.

16. The method for manufacturing a semiconductor device according to claim 15, wherein the metal element is one or a plurality of beryllium, aluminum, zinc, gallium, germanium, silver, cadmium, indium, tin, antimony, gold, lead and bismuth.

17. The method for manufacturing a semiconductor device according to claim 15, wherein the solid solubility limit is a solid solubility limit concentration at a film-formation temperature of the conductive film.

18. A method for manufacturing a semiconductor device, comprising the steps of:

forming a semiconductor region over a substrate;

forming a first insulating film over the semiconductor region;

forming a conductive film including particles formed of the silicon and a metal element layer over the first insulating film while heating the substrate;

oxidizing the metal element layer to form a metal oxide film;

forming a second insulating film over the metal oxide film;

forming a gate electrode over the second insulating film;

etching the second insulating film and the metal oxide film partially to expose a portion of the particles formed of the silicon; and removing the exposed portion of the particles formed of the silicon to form a floating gate electrode.

19. The method for manufacturing a semiconductor device according to claim 18, wherein the metal element is one or a plurality of beryllium, aluminum, zinc, gallium, germanium, silver, cadmium, indium, tin, antimony, gold, lead and bismuth.

20. The method for manufacturing a semiconductor device according to claim 18, wherein the conductive film including particles formed of the silicon and the metal element layer is formed by sputtering, as a target, a solid solution containing the metal element and the silicon that exceeds a solid solubility limit with respect to the metal element.

21. The method for manufacturing a semiconductor device according to claim 20, wherein the solid solubility limit is a solid solubility limit concentration at a film-formation temperature of the conductive film.

22. A method for manufacturing a semiconductor device, comprising the steps of:

forming a semiconductor region over a substrate;

forming a first insulating film over the semiconductor region;

sputtering, as a target, a solid solution containing a metal element and silicon that exceeds a solid solubility limit with respect to the metal element while heating the substrate, so as to form a conductive film including particles formed of the silicon and a metal element layer over the first insulating film;

removing the metal element layer so that the particles formed of the silicon can remain;

forming a mask pattern over the particles formed of the silicon after removing the metal element layer;

etching the particles formed of the silicon partially to form a floating gate electrode;

forming a second insulating film over the floating gate electrode; and forming a gate electrode over the second insulating film.

23. The method for manufacturing a semiconductor device according to claim 22, wherein the metal element is one or a plurality of beryllium, aluminum, zinc, gallium, germanium, silver, cadmium, indium, tin, antimony, gold, lead and bismuth.

24. The method for manufacturing a semiconductor device according to claim 22, wherein the solid solubility limit is a solid solubility limit concentration at a film-formation temperature of the conductive film.

25. A method for manufacturing a semiconductor device, comprising the steps of:

forming a semiconductor region over a substrate;

forming a first insulating film over the semiconductor region;

forming a conductive film including particles formed of the silicon and a metal element layer over the first insulating film while heating the substrate;

oxidizing the metal element layer to form a metal oxide film;

forming a mask pattern over the metal oxide film;

etching the metal oxide film and the particles formed of the silicon partially to form a floating gate electrode;

forming a second insulating film over the floating gate; and forming a gate electrode over the second insulating film.

26. The method for manufacturing a semiconductor device according to claim 25, wherein the metal element is one or a plurality of beryllium, aluminum, zinc, gallium, germanium, silver, cadmium, indium, tin, antimony, gold, lead and bismuth.

27. The method for manufacturing a semiconductor device according to claim 25, wherein the conductive film including particles formed of the silicon and the metal element layer is formed by sputtering, as a target, a solid solution containing the metal element and the silicon that exceeds a solid solubility limit with respect to the metal element.

28. The method for manufacturing a semiconductor device according to claim 27, wherein the solid solubility limit is a solid solubility limit concentration at a film-formation temperature of the conductive film.

* * * * *

UNITED STATES PATENT AND TRADEMARK OFFICE
CERTIFICATE OF CORRECTION

| | |
|---|---|
| PATENT NO. | : 7,335,556 B2 |
| APPLICATION NO. | : 11/146271 |
| DATED | : February 26, 2008 |
| INVENTOR(S) | : Tetsuji Yamaguchi et al. |

It is certified that error appears in the above-identified patent and that said Letters Patent is hereby corrected as shown below:

Delete Drawing Sheet 10 of 19 and substitute therefore the attached Drawing Sheet 10 of 19.
FIG. 11 has been replaced with new FIG. 11.

Signed and Sealed this
Twentieth Day of March, 2012

David J. Kappos
*Director of the United States Patent and Trademark Office*